US012444598B2

(12) United States Patent
Savant et al.

(10) Patent No.: US 12,444,598 B2
(45) Date of Patent: Oct. 14, 2025

(54) GATE STRUCTURE FABRICATION TECHNIQUES FOR REDUCING GATE STRUCTURE WARPAGE

(71) Applicant: Taiwan Semiconductor Manufacturing Company, Ltd., Hsin-Chu (TW)

(72) Inventors: Chandrashekhar Prakash Savant, Hsinchu (TW); Kin Shun Chong, Hsinchu (TW); Tien-Wei Yu, Hsinchu (TW); Chia-Ming Tsai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 574 days.

(21) Appl. No.: 17/825,798

(22) Filed: May 26, 2022

(65) Prior Publication Data

US 2023/0162973 A1 May 25, 2023

Related U.S. Application Data

(60) Provisional application No. 63/282,777, filed on Nov. 24, 2021.

(51) Int. Cl.
*H01L 21/02* (2006.01)
*C23C 16/02* (2006.01)
(Continued)

(52) U.S. Cl.
CPC .... *H01L 21/0217* (2013.01); *H01L 21/02274* (2013.01); *H10D 30/024* (2025.01);
(Continued)

(58) Field of Classification Search
CPC .......... H01L 21/0217; H01L 21/02274; H01L 27/0886; H01L 29/66545; H01L 29/66795; C23C 16/0245
See application file for complete search history.

(56) References Cited

U.S. PATENT DOCUMENTS 6,277,729 B1 * 8/2001 Wu .................. H01L 21/76856
438/629
7,732,342 B2 6/2010 Balseanu et al.
(Continued)

FOREIGN PATENT DOCUMENTS

| TW | 200849485 A | 12/2008 |
| TW | 201526162 A | 7/2015 |

OTHER PUBLICATIONS

Manuj Nahar, Noel Rocklein, Michael Andreas, Greg Funston, and Duane Goodner. "Stress Modulation of Titanium Nitride Thin Films Deposited Using Atomic Layer Deposition". Journal of Vacuum Science & Technology A 35, 01B144 (2017).
(Continued)

*Primary Examiner* — Zandra V Smith
*Assistant Examiner* — Andre C Stevenson
(74) *Attorney, Agent, or Firm* — HAYNES AND BOONE, LLP

(57) ABSTRACT

Gate fabrication techniques are disclosed herein for providing gate stacks and/or gate structures (e.g., high-k/metal gates) with improved profiles (e.g., minimal to no warping, bending, bowing, and necking and/or substantially vertical sidewalls), which may be implemented in various device types. For example, gate fabrication techniques disclosed herein provide gate stacks with stress-treated glue layers having a residual stress that is less than about 1.0 gigapascals (GPa) (e.g., about −2.5 GPa to about 0.8 GPa). In some embodiments, a stress-treated glue layer is provided by depositing a glue layer over a work function layer and
(Continued)

performing a stress reduction treatment, such as an ion implantation process and/or an annealing process in a gas ambient, on the glue layer. In some embodiments, a stress-treated glue layer is provided by forming at least one glue sublayer/metal layer pair over a work function layer, performing a poisoning process, and forming a glue sublayer over the pair.

20 Claims, 15 Drawing Sheets

(51) Int. Cl.
*H10D 30/01* (2025.01)
*H10D 64/01* (2025.01)
*H10D 84/83* (2025.01)

(52) U.S. Cl.
CPC ......... *H10D 64/017* (2025.01); *H10D 84/834* (2025.01); *C23C 16/0245* (2013.01)

(56) References Cited

U.S. PATENT DOCUMENTS

| 2013/0241004 A1* | 9/2013 | Yin | H10D 30/794 |
| | | | 257/E27.061 |
| 2020/0105909 A1 | 4/2020 | Wu | |
| 2021/0083112 A1* | 3/2021 | Wu | H10D 64/01 |

OTHER PUBLICATIONS

Huang, J. H., Ma, C. H., & Chen, H. D. (2006). Effect of Ti interlayer on the residual stress and texture development of TiN thin films. Surface and Coatings Technology, 200(20-21), 5937-5945. https://doi.org/10.1016/j.surfcoat.2005.09.005.

* cited by examiner

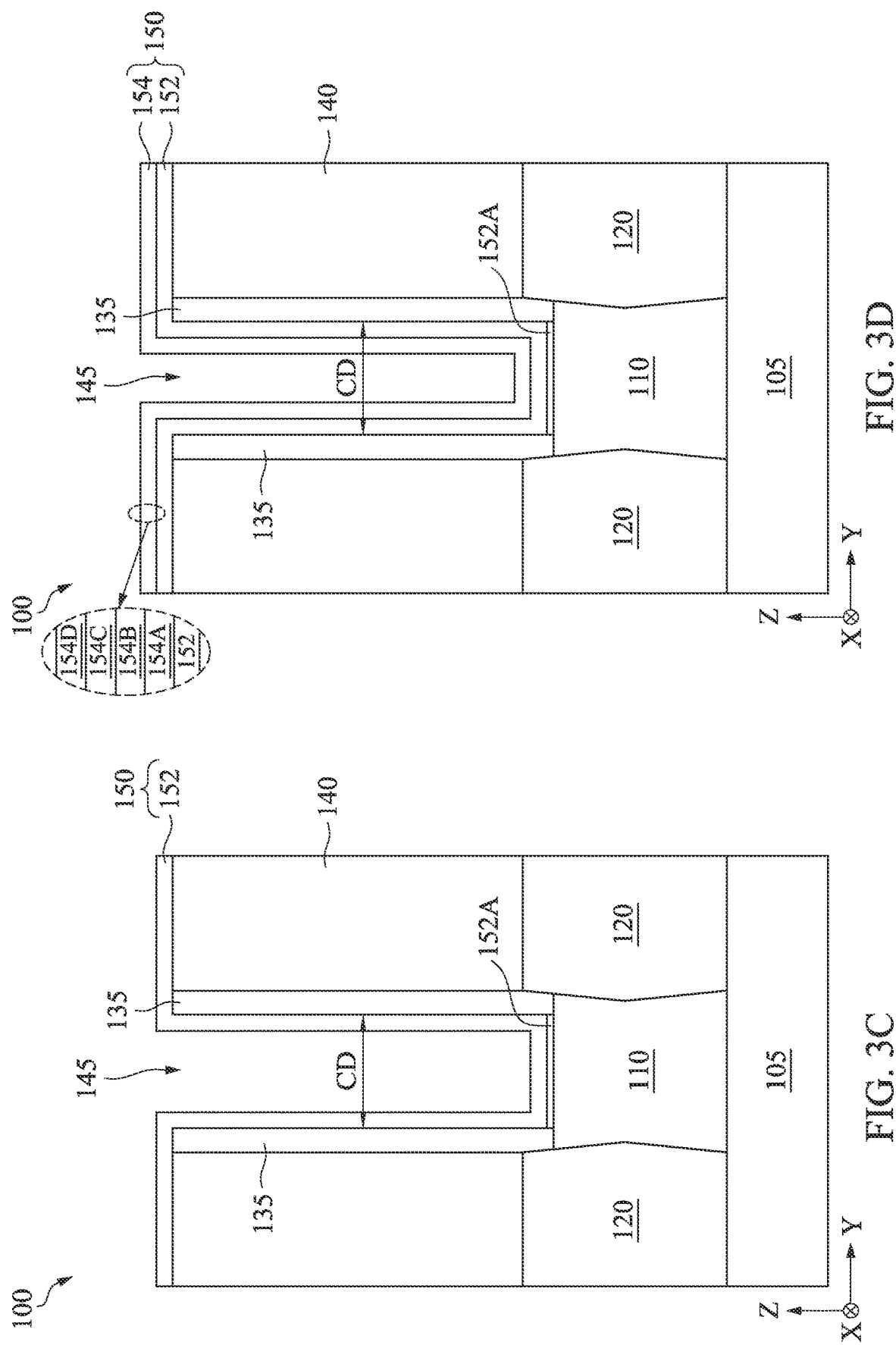

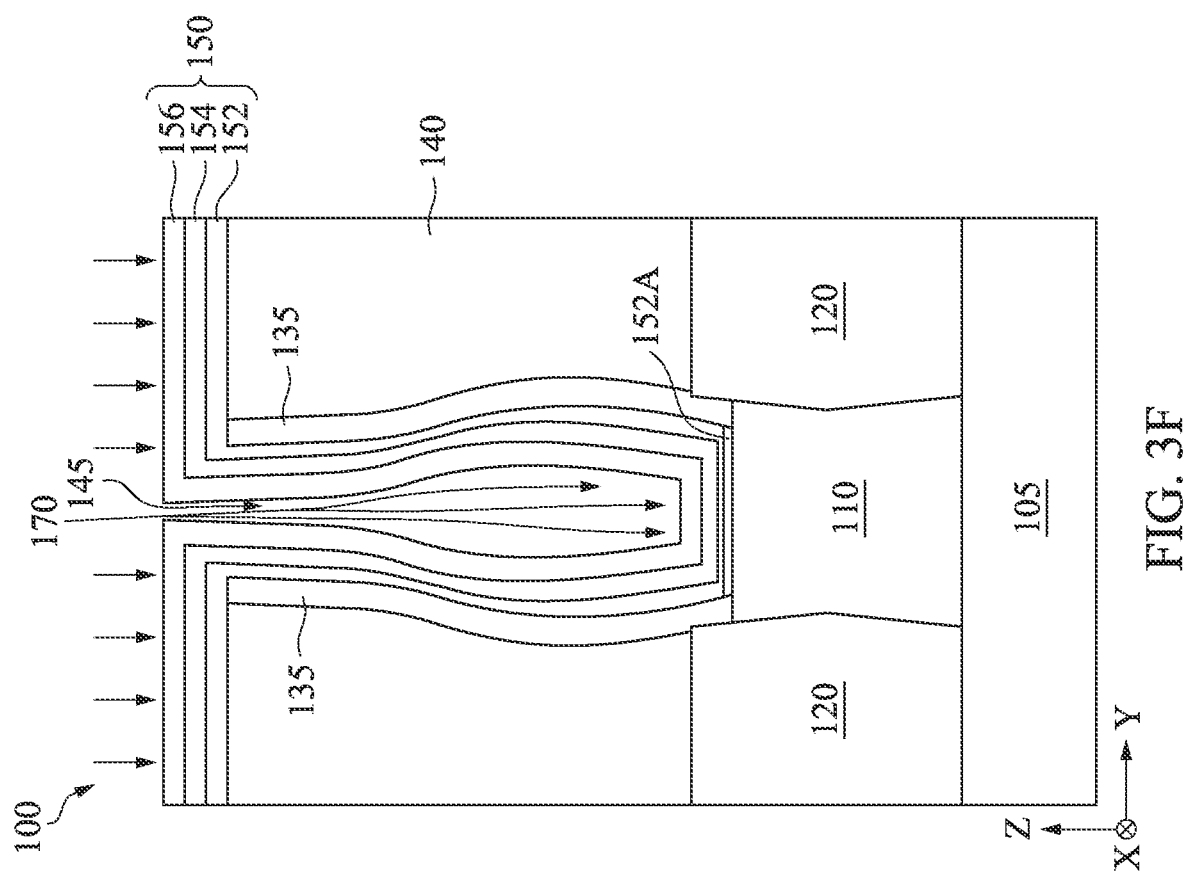
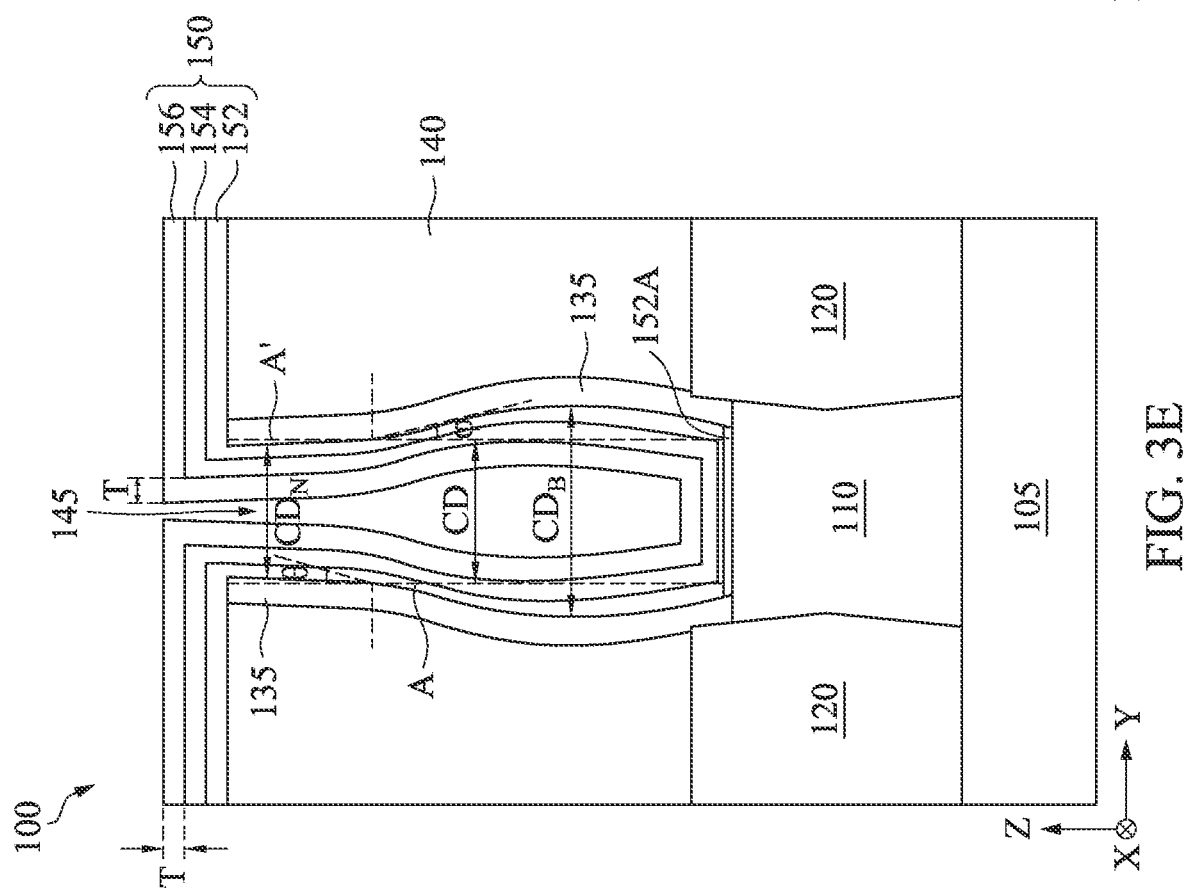

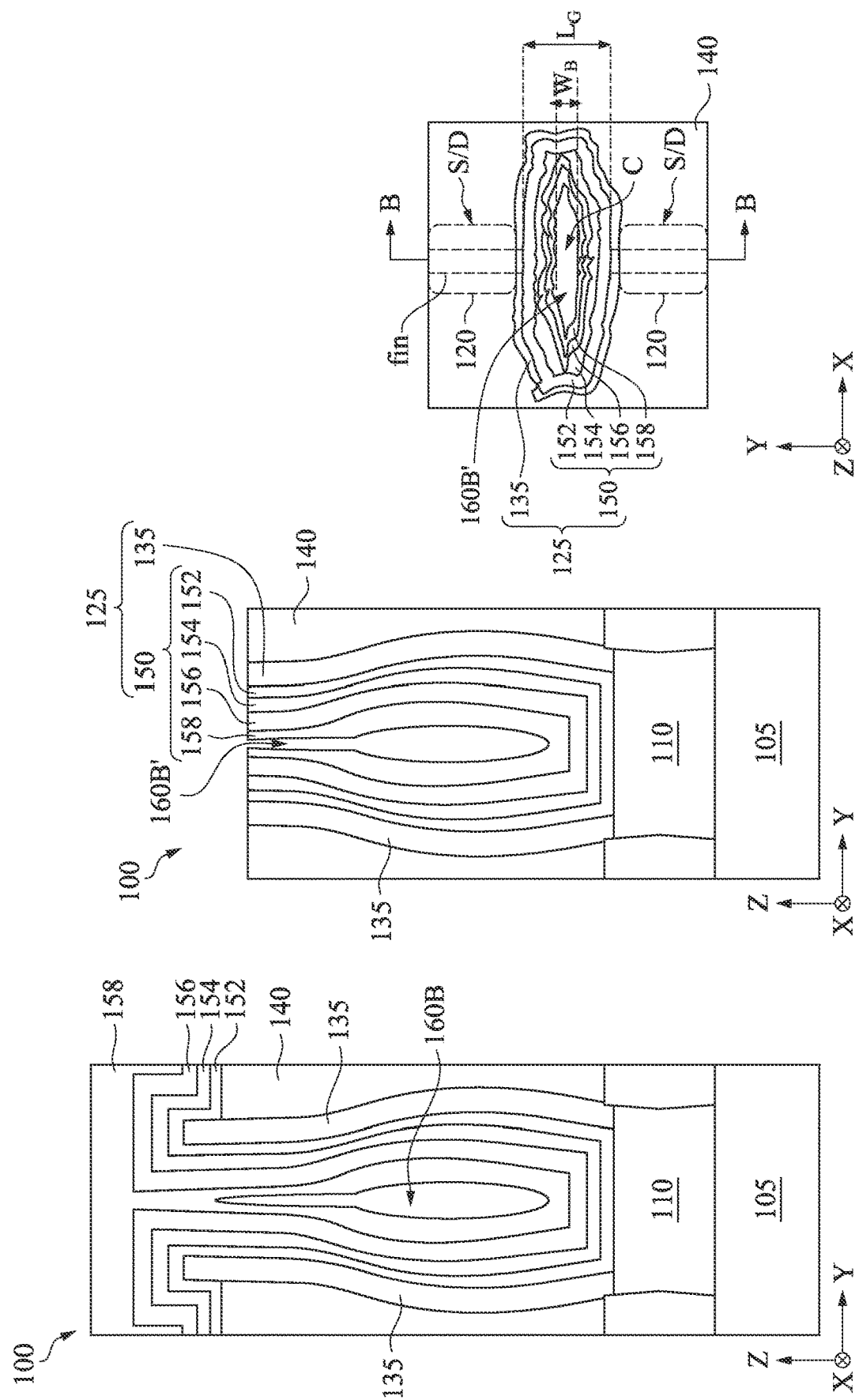

GATE STRUCTURE FABRICATION TECHNIQUES FOR REDUCING GATE STRUCTURE WARPAGE

This is a non-provisional application of and claims benefit of U.S. Provisional Patent Application Ser. No. 63/282,777, filed Nov. 24, 2021, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, gate replacement processes, which typically involve replacing polysilicon gate electrodes with metal gate electrodes, have been implemented to improve device performance, where work function values of the metal gate electrodes are tuned during the gate replacement process to provide devices having different threshold (operating) voltages. Although existing gate fabrication techniques and/or gate replacement processes have been generally adequate for their intended purposes, they have not been entirely satisfactory in all respects as IC technologies and/or IC feature dimensions shrink.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3I are fragmentary cross-sectional views of a device, in portion or entirety, at various gate stack fabrication stages when a glue layer of a gate stack of the device is stress-treated according to various aspects of the present disclosure.

FIG. 6A and FIG. 6B are fragmentary cross-sectional views of a device, in portion or entirety, at various gate stack fabrication stages when a glue layer of a gate stack of the device is not stress-treated according to various aspects of the present disclosure.

FIG. 7 is a top view of the device, in portion or entirety, of FIG. 6B according to various aspects of the present disclosure.

DETAILED DESCRIPTION

Figure 1:
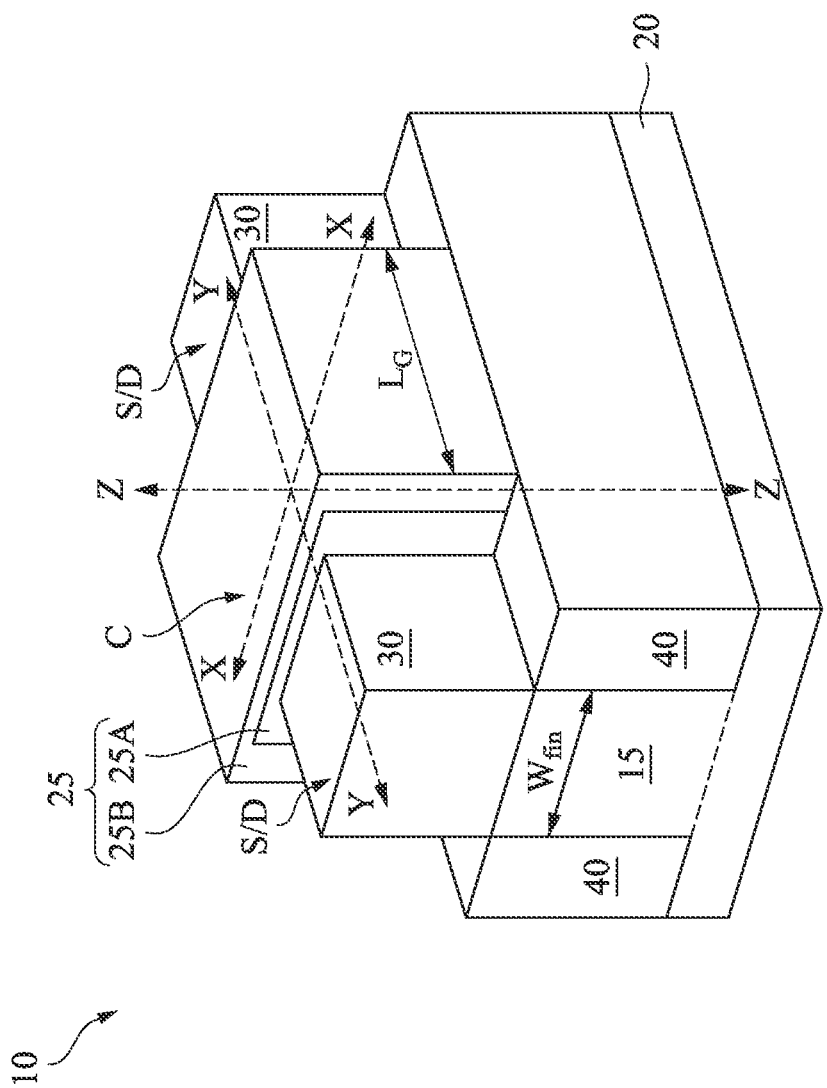
FIG. 1 is a fragmentary perspective view of an exemplary multigate device, in portion or entirety, according to various aspects of the present disclosure.

The present disclosure relates generally to gate stacks of electronic devices, and more particularly, to gate stacks (e.g., high-k/metal gates) having improved profiles (e.g., minimal to no bowing and/or necking) and methods of fabricating such gate stacks.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

For advanced IC technology nodes, non-planar transistors, such as fin-like field effect transistors (FinFETs) and gate-all-around (GAA) transistors (collectively referred to as multigate devices), have become a popular and promising candidate for high performance and low leakage applications. FIG. 1 is a fragmentary perspective view of an exemplary multigate device 10, in portion or entirety, according to various aspects of the present disclosure. Multigate device 10 is a FinFET that includes a fin 15 extending from a substrate 20. Fin 15 has a length along a y-direction, a width along an x-direction ($W_{fin}$), and a height along a z-direction. In FIG. 1, fin 15 has a non-recessed portion disposed between recessed portions, and the FinFET further includes a gate stack 25 that wraps and engages the non-recessed portion of fin 15 (e.g., gate stack 25 is disposed on a top and opposing sidewalls of the non-recessed portion of fin 15) and epitaxial source/drains 30 disposed over the recessed portions of fin 15 (e.g., epitaxial source/drains 30 are disposed on tops of the recessed portions of fin 15). The FinFET has a channel region (C) disposed between source/drain regions (S/D), where the channel region is provided by the non-recessed portion of fin 15 and the source/drain regions are provided by epitaxial source/drains 30 and underlying recessed portions of fin 15. During operation of the FinFET, current can flow through the channel region (e.g., non-recessed portion of fin 15) and between the source/drain regions (e.g., epitaxial source/drains 30). Gate stack 25 has a gate length ($L_G$) along the y-direction, and in the depicted embodiment, gate stack 25 includes a gate dielectric 25A and a gate electrode 25B. Gate spacers (not shown in FIG. 1) are disposed along sidewalls of gate stack 25, and the gate spacers also wrap the non-recessed portion of fin 15. A substrate isolation feature 40, such as shallow trench isolation (STI) structure, electrically isolates the FinFET from other devices and/or regions of multigate device 10. Substrate isolation feature 40 is disposed over substrate 20, along sidewalls of the recessed portions of fin 15, and along sidewalls of lower portions of the non-recessed portion of fin 15. Gate stack 25 extends over the top of substrate isolation feature 40. In some embodiments, substrate isolation feature 40 surrounds a lower portion of fin 15. In some embodiments, fin 15 is not recessed in the source/drain regions of the FinFET, and epitaxial source/drains 30 wrap fin 15 (e.g., epitaxial source/drains 30 are disposed on tops and opposing sidewalls of fin 15). FIG. 1 has been simplified for the sake of clarity to better understand the inventive concepts of the present disclosure. Additional features can be added in multigate device 10, and some of the features described below can be replaced, modified, or eliminated in other embodiments of multigate device 10.

Gate stack 25 may be formed by a gate replacement process, which typically involves removing a dummy gate (e.g., a polysilicon gate) of a gate structure to form a gate opening (having, for example, sidewalls formed by gate spacers of the gate structure) and forming gate stack 25 in the gate opening. As IC feature sizes continue to shrink with advanced IC technology nodes, dimensions of the FinFET, such as fin width $W_{fin}$ and gate length $L_G$, are correspondingly decreasing, which has led to a significantly smaller gate opening during the gate replacement process. Gate replacement processes having smaller gate openings are more susceptible to forming voids and/or seams in gate stack 25. In particular, it has been observed that the gate replacement process is especially sensitive to residual stress in various layers of gate stack 25 as FinFET dimensions, and thus dimensions of gate openings, shrink. For example, residual stress in a glue layer of gate stack 25 has been observed to deform and/or warp gate stack 25 during the gate replacement process and prevent complete filling of the gate opening, which has led to undesired voids and/or seams forming in gate stack 25. Such voids and/or seams provide a path for chemicals and/or other impurities to reach and damage channel region C during subsequent processing, thereby significantly degrading performance and/or reliability of the FinFET.

The present disclosure addresses such challenges by providing gate stacks with stress-treated glue layers, which are formed between work function layers of the gate stacks and metal fill layers of the gate stacks. The stress reduction treatment is configured to modify properties and/or characteristics of the glue layer, such that the glue layer has a compressive residual stress or a negligible tensile residual stress (i.e., a residual stress that is less than about 0.8 GPa). Various stress reduction treatments disclosed herein have been observed to reduce residual stress and/or other characteristics (e.g., d-spacing) in a glue layer, reduce warping of a gate structure that includes the glue layer (e.g., a gate stack and/or the gate spacers), and significantly reduce (and even eliminate) void and/or seam formation in a gate stack that includes the glue layer. Various characteristics of a gate structure and/or a glue layer thereof that result from implementing the proposed stress reduction treatments, and corresponding gate replacement processes are disclosed herein. Details of the proposed stress reduction techniques and/or gate fabrication techniques are described herein in the following pages.

Figure 2:
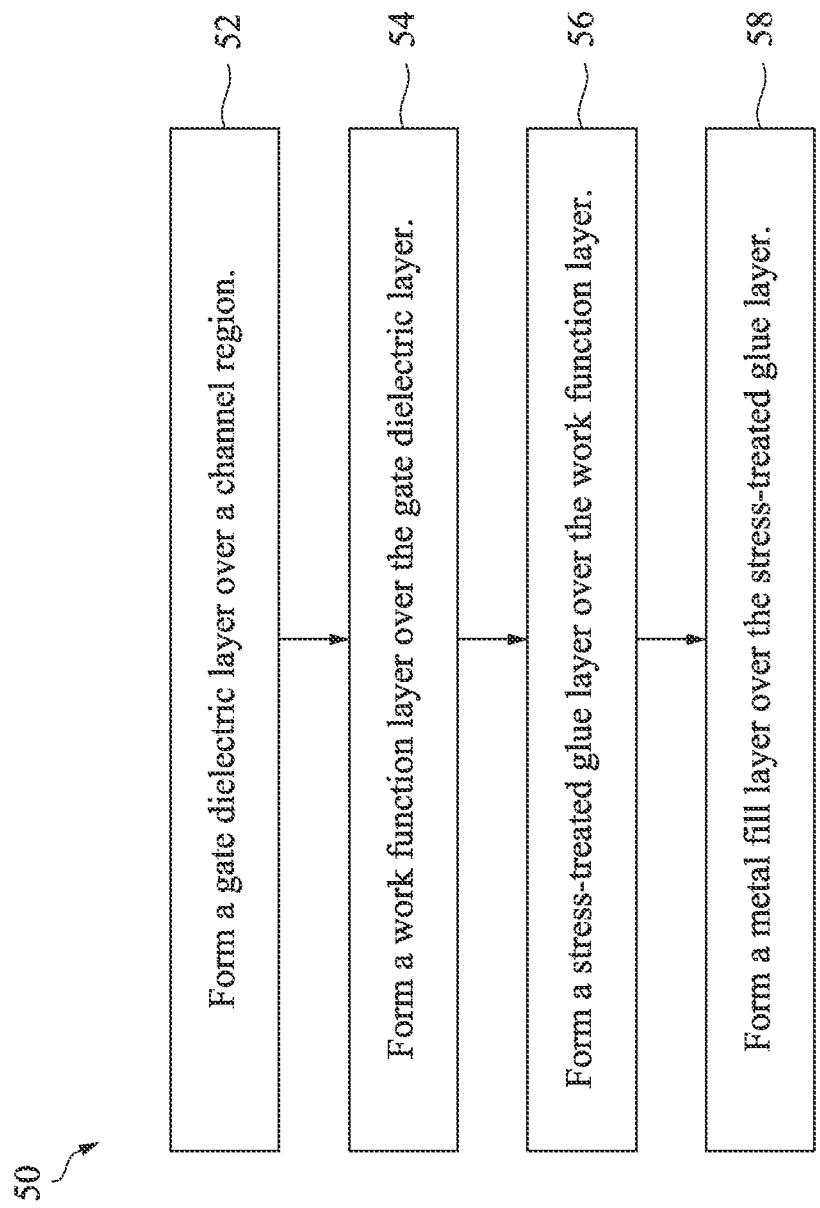
FIG. 2 is a flow chart of a method for fabricating a device having a gate stack with a stress-treated glue layer according to various aspects of the present disclosure.

FIG. 2 is a flow chart of a method 50 for fabricating a device having a gate structure with an improved profile (e.g., minimal to no warping, bending, bowing, and necking and/or substantially vertical sidewalls) according to various aspects of the present disclosure. At block 52, method 50 includes forming a gate dielectric layer over a channel region. At block 54, method 50 includes forming a work function layer over the gate dielectric layer. At block 56, method 50 includes forming a stress-treated glue layer over the work function layer. In some embodiments, the stress-treated glue layer is formed by depositing a glue layer over the work function layer and performing a stress reduction treatment on the glue layer (e.g., an ion implantation process and/or a thermal process). In some embodiments, the stress-treated glue layer is formed by depositing glue sublayers, depositing metal layers between the glue sublayers, and performing a hydrogen poisoning process (or other suitable poisoning process) on the glue sublayers and/or the metal layers. At block 58, method 50 includes forming a metal fill layer over the stress-treated glue layer. In some embodiments, method 50 is implemented in a gate last process (i.e., a gate replacement process). In such embodiments, a dummy gate (e.g., a polysilicon gate) is removed to form a gate opening, which is defined between gate spacers of the gate structure, and the gate dielectric layer, the work function layer, the stress-treated glue layer, and the metal fill layer are formed in and fill the gate opening. A planarization process may be performed that removes excess gate materials from over a top of a dielectric layer (e.g., an interlevel dielectric (ILD) layer), where a remainder of the gate materials fill the gate opening and form the gate stack of the gate structure, which includes the gate dielectric layer, the work function layer, the stress-treated glue layer, and the metal fill layer. In some embodiments, method 50 is implemented in a gate first process. In such embodiments, the gate dielectric layer, the work function layer, the stress-treated glue layer, and the metal fill layer are formed over a substrate that includes the channel region and then subsequently patterned to form the gate stack of the gate structure, which includes the gate dielectric layer, the work function layer, the stress-treated glue layer, and the metal fill layer. A dielectric layer (e.g., ILD layer) may be formed after patterning the various gate layers to form the gate stack. In some embodiments, method 50 is implemented in a hybrid gate first-gate last process. Additional steps can be provided before, during, and after method 50, and some of the steps described can be moved, replaced, or eliminated for additional embodiments of method 50.

FIGS. 3A-3I are fragmentary cross-sectional views of a device 100, in portion or entirety, at various fabrication stages (such as those associated with method 50 in FIG. 2) according to various aspects of the present disclosure. The cross-sectional views of FIGS. 3A-3I are obtained by "cutting" a device along the y-direction shown in FIG. 1, and thus, the cross-sectional views in FIGS. 3A-3I may be referred to as y-cut views. It is noted that the y-cut views are taken through a portion of the device that includes a channel region disposed between source/drain regions and where a gate structure is disposed over a top of the channel region, instead of a portion of the device where the gate structure wraps the channel region (i.e., the y-cut views are through the Y-Z plane instead of the X-Z plane of a multigate device). Device 100 may be included in a microprocessor, a memory, and/or IC. Device 100 may be a portion of an IC chip, a system on chip (SoC), or portion thereof, that includes various passive and active microelectronic devices, such as transistors, resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components and/or devices, or combinations thereof. FIGS. 3A-3I have been simplified for the sake of clarity to better understand the inventive concepts of the present disclosure. Additional features can be added in device 100, and some of the features described below can be replaced, modified, or eliminated in other embodiments of device 100.

Figure 3A:
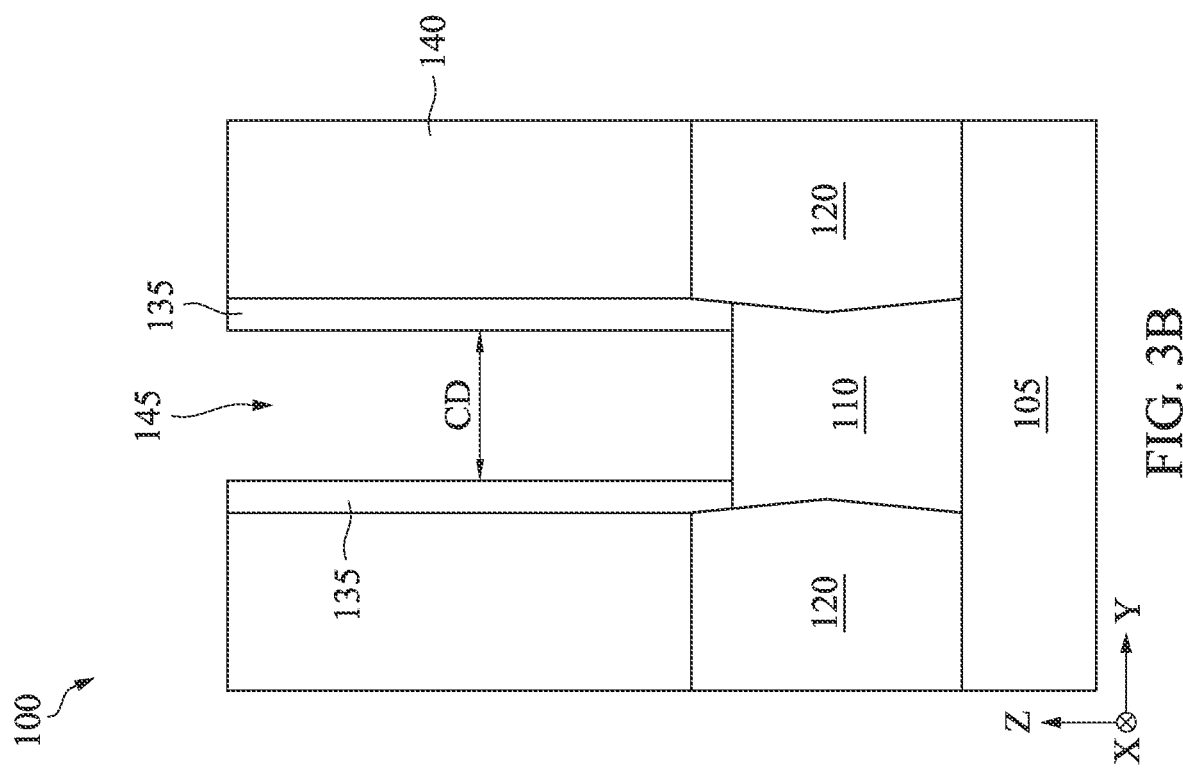

Turning to FIG. 3A, device 100 includes a substrate (wafer) 105. Substrate 105 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In the depicted embodiment, substrate 105 is a silicon substrate. In some embodiments, substrate 105 is a semiconductor-on-insulator substrate, such as a silicon-on-insulator (SOI) substrate, a silicon germanium-on-insulator (SGOI) substrate, or a germanium-on-insulator (GOI) substrate. Substrate 105 can include various doped regions, such as p-type doped regions (e.g., p-wells), n-type doped regions (e.g., n-wells), or combinations thereof. N-type doped regions include n-type dopants, such as phosphorus, arsenic, other n-type dopant, or combinations thereof. P-type doped regions include p-type dopants, such as boron, indium, other p-type dopant, or combinations thereof. In some embodiments, the doped regions include a combination of p-type dopants and n-type dopants. The doped regions can be formed directly on and/or in substrate 105, for example, providing a p-well structure, an n-well structure, a dual-well structure, a raised structure, other suitable structure, or combinations thereof.

Device 100 includes a channel region 110 disposed between epitaxial source/drains 120, and a gate structure 125 disposed over channel region 110. Channel region 110 (also referred to as a channel layer) extends lengthwise along the y-direction, having a length along the y-direction, a width along the x-direction, and a height along the z-direction. Channel region 110 includes an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In the depicted embodiment, channel region 110 includes silicon, germanium, silicon germanium, other suitable semiconductor material, or combinations thereof. When device 100 is a FinFET, such as in the depicted embodiment, channel region 110 is a portion of a semiconductor fin extending from substrate 105 and can be referred to as a fin or a fin structure. In some embodiments, channel region 110 is a portion of substrate 105, such as a portion of a material layer of substrate 105. For example, where substrate 105 includes silicon, channel region 110 includes silicon (i.e., channel region 110 is a silicon fin). In some embodiments, channel region 110 is a semiconductor layer extending from substrate 105 (e.g., channel region 110 is a silicon germanium fin). When device 100 is a GAA transistor, channel region 110 may be a semiconductor layer stack (e.g., silicon germanium layers and silicon layers stacked along the z-direction in an interleaving, alternating configuration over substrate 105) that is subsequently processed to form one or more semiconductor layers suspended over substrate 105 (e.g., silicon nanowire(s), which will be at least partially surrounded by a gate).

Epitaxial source/drains 120 include a semiconductor material and may be doped with n-type dopants and/or p-type dopants. In embodiments where device 100 is an n-type transistor, epitaxial source/drains 120 can include silicon doped with carbon, phosphorous, arsenic, other n-type dopant, or combinations thereof (for example, Si:C epitaxial source/drains, Si:P epitaxial source/drains, or Si:C:P epitaxial source/drains). In embodiments where device 100 is a p-type transistor, epitaxial source/drains 120 can include silicon germanium or germanium doped with boron, other p-type dopant, or combinations thereof (for example, Si:Ge:B epitaxial source/drains). In some embodiments, epitaxial source/drains 120 include more than one epitaxial semiconductor layer, where the epitaxial semiconductor layers can include the same or different materials and/or the same or different dopant concentrations. In some embodiments, epitaxial source/drains 120 include materials and/or dopants that achieve desired tensile stress and/or compressive stress in channel region 110. In some embodiments, doped regions, such as heavily doped source/drain (HDD) regions, lightly doped source/drain (LDD) regions, other doped regions, or combinations thereof, are disposed in epitaxial source/drains 120. In such embodiments, doped regions (e.g., LDD regions) may extend into channel region 110. As used herein, source/drain region and/or epitaxial source/drain may refer to a source of device 100, a drain of device 100, or a source and/or a drain of multiple devices (including device 100).

Gate structure 125 includes a dummy gate 130 disposed over a channel region of device 100 (e.g., channel region 110) and between source/drain regions of device 100 (e.g., epitaxial source/drains 120). Dummy gate 130 extends lengthwise in a direction that is different than (e.g., orthogonal to) the lengthwise direction of channel region 110. For example, dummy gate 130 extends lengthwise along the x-direction, having a length along the x-direction, a width along the y-direction, and a height along the z-direction. In the Y-Z plane (FIG. 3A), dummy gate 130 is disposed on a top of channel region 110. A width of dummy gate 130 along the y-direction defines a critical dimension (CD) of gate structure 125, which is a desired gate length ($L_G$) of a gate stack of gate structure 125. In some embodiments, critical dimension CD is about 14 nm to about 20 nm. In the X-Z plane, when channel region 110 is formed in a portion of a semiconductor fin extending from substrate 105 such as depicted, dummy gate 130 is disposed over a top and sidewalls of channel region 110, such that dummy gate 130 wraps channel region 110. In some embodiments, dummy gate 130 includes a dummy gate electrode and a hard mask over the dummy gate electrode. The dummy gate electrode includes a suitable dummy gate material, and the hard mask includes a suitable hard mask material. For example, the dummy gate electrode includes a polysilicon layer, and the hard mask includes a silicon nitride layer. In such embodiments, dummy gate 130 may be referred to as a poly gate. Dummy gate 130 can include other layers, such as capping layers, interface layers, diffusion layers, barrier layers, or combinations thereof. In some embodiments, dummy gate 130 includes a dielectric layer between the dummy gate electrode and channel region 110, such as a dummy gate dielectric and/or an interfacial layer (including, for example, silicon oxide).

Gate structure 125 also includes gate spacers 135 disposed adjacent to (for example, along sidewalls of) dummy gate 130. Gate spacers 135 include a dielectric material, which can include silicon, oxygen, carbon, nitrogen, other suitable material, or combinations thereof (e.g., silicon oxide, silicon nitride, silicon oxynitride, silicon carbide, silicon carbon nitride, silicon oxycarbide, silicon oxycarbonitride, or combinations thereof). In some embodiments, gate spacers 135 include a multi-layer structure, such as a first dielectric layer (e.g., a silicon oxide layer) and a second dielectric layer (e.g., a silicon nitride layer). In some embodiments, gate spacers 135 include more than one set of spacers, such as seal spacers, offset spacers, sacrificial spacers, dummy spacers, main spacers, or combinations thereof. In such embodiments, the different spacers can include different materials having different etch rates.

Dielectric layer 140 is disposed over substrate 105, channel region 110, epitaxial source/drains 120, and gate structure 125. Dielectric layer 140 may be a portion of a multilayer interconnect (MLI) feature that electrically couples various devices (for example, transistors, resistors, capacitors, and/or inductors) and/or components (for example, gate stacks and/or source/drains) of device 100, such that the various devices and/or components can operate as needed. Dielectric layer 140 can have a multi-layer structure, such as an interlayer dielectric (ILD) layer over a contact etch stop layer (CESL). The ILD layer includes a dielectric material including, for example, silicon oxide, carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), Black Diamond® (Applied Materials of Santa Clara, California), xerogel, aerogel, amorphous fluorinated carbon, parylene, benzocyclobutene-based (BCB) dielectric material, SiLK (Dow Chemical, Midland, Michigan), polyimide, other suitable dielectric material, or combinations thereof. In some embodiments, the ILD layer includes a dielectric material having a dielectric constant that is less than a dielectric constant of silicon dioxide (e.g., k<3.9). In some embodiments, the ILD layer includes a dielectric material having a dielectric constant that is less than about 2.5 (i.e., an extreme low-k (ELK) dielectric material), such as porous silicon oxide, silicon carbide (SiC), and/or carbon-doped oxide (for example, an SiCOH-based material (having, for example, Si—$CH_3$ bonds)), each of which is tuned/configured to exhibit a dielectric constant less than about 2.5. The CESL includes a dielectric material that is different than the dielectric material of the ILD layer. For example, where the ILD layer includes a low-k dielectric material (e.g., porous silicon oxide), the CESL can include silicon and nitrogen, such as silicon nitride, silicon carbonitride, or silicon oxycarbonitride.

Figure 3B:
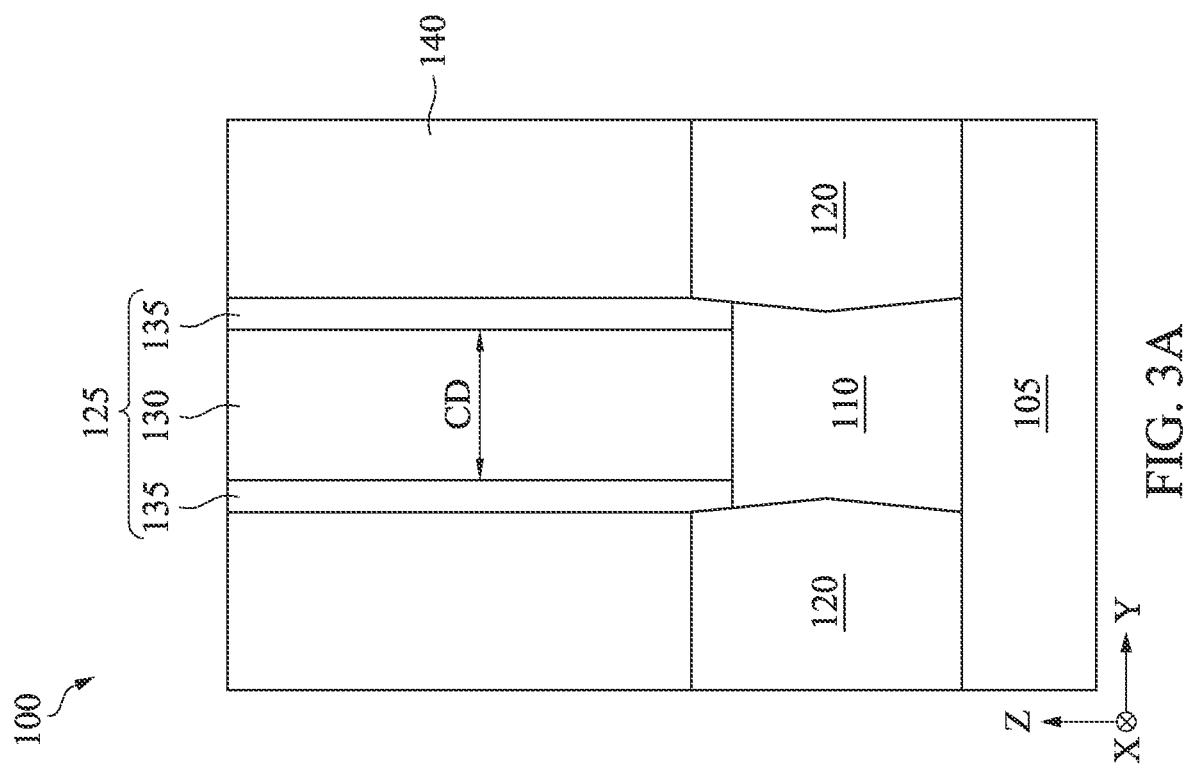

Turning to FIGS. 3B-3I, processing continues with performing a gate replacement process, for example, by removing dummy gate 130 from gate structure 125 to form a gate opening 145 that exposes channel region 110 (FIG. 3B) and filling gate opening 145 with a gate stack 150 (FIGS. 3C-3I) (i.e., dummy gate 130 is replaced with gate stack 150). In FIG. 3B, gate opening 145 has sidewalls formed by gate spacers 135 and a bottom formed by channel region 110. A width of gate opening 145 along the lengthwise direction of the channel (e.g., the y-direction) is about equal to critical dimension CD. In the depicted embodiment, gate spacers 135 have substantially vertical sidewalls that extend along the z-direction, which provide gate opening 145 with a width that is substantially uniform from top to bottom. In other words, critical dimension CD is substantially the same from a top of gate opening 145 that is proximate to a top surface of dielectric layer 140 to a bottom of gate opening 145 that is proximate to a top surface of channel region 110. In some embodiments, an etching process selectively removes dummy gate 130 with respect to gate spacers 135 and/or dielectric layer 140. For example, the etching process substantially removes dummy gate 130 but does not remove, or does not substantially remove, gate spacers 135 and/or dielectric layer 140. In some embodiments, an etchant is selected for the etching process that etches polysilicon (i.e., dummy gate 130) at a higher rate than dielectric materials (i.e., gate spacers 135 and/or dielectric layer 140) (i.e., the etchant has a high etch selectivity with respect to polysilicon). The etching process is a dry etch, a wet etch, other suitable etching process, or combinations thereof. The etching process may also be tuned to remove dummy gate 130 without (or minimally) removing channel region 110. In some embodiments, the etching process uses a patterned mask layer (i.e., an etch mask) that covers dielectric layer 140 and/or gate spacers 135 but exposes dummy gate 130.

In FIG. 3C, a gate dielectric layer 152 is formed over substrate 105. Gate dielectric layer 152 has a substantially uniform thickness and partially fills gate opening 145. Gate dielectric layer 152 is disposed on gate spacers 135 (which form the sidewalls of gate opening 145), channel region 110 (which forms the bottom of gate opening 145), and dielectric layer 140. In some embodiments, gate dielectric layer 152 has a thickness of about 10 Å to about 200 Å. Gate dielectric layer 152 includes a high-k dielectric material, such as $HfO_2$, $HfSiO$, $HfSiO_4$, $HfSiON$, $HfLaO$, $HfTaO$, $HfSiO$, $HfZrO$, $HfAlO_x$, $ZrO$, $ZrO_2$, $ZrSiO_2$, $AlO$, $AlSiO$, $Al_2O_3$, $TiO$, $TiO_2$, $LaO$, $LaSiO$, $LaO_3$, $La_2O_3$, $Ta_2O_3$, $Ta_2O_5$, $Y_2O_3$, $SrTiO_3$, $Ba_7rO$, $BaTiO_3$ (BTO), $(Ba,Sr)TiO_3$ (BST), $Si_3N_4$, $HfO_2$-$Al_2O_3$, other suitable high-k dielectric material, or combinations thereof. High-k dielectric material generally refers to dielectric materials having a high dielectric constant, for example, greater than that of silicon dioxide (k≈3.9). In some embodiments, gate dielectric layer 152 includes another suitable dielectric material, such as $SiO_2$ or other suitable dielectric material. Gate dielectric layer 152 can have a multilayer structure. Gate dielectric layer 152 is formed by atomic layer deposition (ALD), physical vapor deposition (PVD), chemical vapor deposition (CVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), thermal oxidation, chemical oxidation, other suitable methods, or combinations thereof.

An interfacial layer 152A may be formed between channel region 110 and gate dielectric layer 152. Interfacial layer 152A includes a dielectric material, such as $SiO_2$, $SiGeO_x$, $HfSiO$, $SiON$, other silicon-comprising dielectric material, other suitable material, or combinations thereof. Interfacial layer 152A is formed by thermal oxidation, chemical oxidation, ALD, CVD, other suitable process (such as those described herein), or combinations thereof. A thickness of interfacial layer 152A is less than a thickness of gate dielectric layer 152. In some embodiments, a thickness of interfacial layer 152A is about 5 A to about 50 A.

In FIG. 3D, a metal gate layer 154 is formed over substrate 105. Metal gate layer 154 has a substantially uniform thickness and partially fills gate opening 145. Metal gate layer 154 is disposed on gate dielectric layer 152. In some embodiments, a thickness of metal gate layer 154 is about 20 A to about 800 A. Metal gate layer 154 is formed by ALD, PVD, CVD, HDPCVD, MOCVD, RPCVD, PECVD, LPCVD, ALCVD, APCVD, plating, other suitable methods, or combinations thereof. In the depicted embodiment, metal gate layer 154 has a multilayer structure, such as a metal layer 154A, a metal layer 154B, a metal layer 154C, and a metal layer 154D from bottom to top. Metal layer 154A physically contacts gate dielectric layer 152, metal layer 154B physically contacts metal layer 154A, metal layer 154C physically contacts metal layer 154B, and metal layer 154D physically contacts metal layer 154C. A thickness of metal layer 154B may be greater than each of a thickness of metal layer 154A, a thickness of metal layer 154B, and a thickness of metal layer 154D. In some embodiments, a thickness of each of metal layer 154A, metal layer 154C, and metal layer 154D is about 10 Å to about 200 Å. In some embodiments, a thickness of metal layer 154B is about 10 Å to about 500 Å. In some embodiments, a thickness of metal layer 154D is about 10 Å to about 20 Å (e.g., 14 Å).

In some embodiments, metal layer 154B is a work function layer, and metal layer 154A, metal layer 154C, and metal layer 154D are capping (cap) layers, blocking layers, barrier layers, or combinations thereof. For example, metal layer 154A, metal layer 154C, and metal layer 154D each include a material that prevents or eliminates diffusion and/or reaction of constituents between adjacent layers and/or promotes adhesion between adjacent layers, such as between gate dielectric layer 152 and metal layer 154B or between metal layer 154B and a subsequently formed metal fill layer. In some embodiments, metal layer 154A, metal layer 154C, metal layer 154D, or combinations thereof each include metal and nitrogen, such as titanium nitride, tantalum nitride, tungsten nitride (e.g., $W_2N$), titanium silicon nitride (TiSiN), tantalum silicon nitride (TaSiN), other suitable metal nitride, or combinations thereof. In some embodiments, metal layer 154A, metal layer 154C, metal layer 154D, or combinations thereof include an amorphous material, such as amorphous silicon, amorphous carbon, amorphous germanium, other amorphous material, or combinations thereof. In the depicted embodiment, metal layer 154A and metal layer 154C are metal nitride layers (e.g., titanium nitride (TiN) layers (e.g., TiN layers) or tantalum nitride (TaN) layers), and metal layer 154D is an amorphous material layer (e.g., an amorphous silicon layer). The present disclosure contemplates any suitable materials for metal layer 154A, metal layer 154C, and metal layer 154D.

Metal layer 154B includes a metal material with a proper work function. In the depicted embodiment, metal layer 154B includes an n-type work function metal (nWFM), which generally refers to a metal material or a metal-containing material with a work function value closer to a conduction band energy than a valence band energy of a material of channel region 110. In some embodiments, metal layer 154B is an nWFM layer that includes an aluminum-based material, such as titanium aluminum (TiAl), titanium aluminum carbide (TiAlC), titanium silicon aluminum carbide (TiSiAlC), tantalum aluminum (TaAl), tantalum aluminum carbide (TaAlC), Al-doped Ti, Al-doped TiN, Al-doped Ta, Al-doped TaN, other suitable aluminum-based nWFM, or combinations thereof. For example, metal layer 154B is a TiAlC layer. In another example, metal layer 154B is a TiSiAlC layer. In yet another example, metal layer 154B is a TaAlC layer. In some embodiments, metal layer 154B includes a p-type work function metal (pWFM), which generally refers to a metal material or a metal-containing material with a work function value closer to a valence band energy than a conduction band energy of a material of channel region 110. In some embodiments, metal layer 154B is a pWFM layer that is substantially aluminum free, such as a titanium-based nitride (e.g., TiN and/or TiSiN), a tantalum-based nitride (e.g., TaN and/or TaSiN), a titanium-based alloy (including, for example, titanium and gold, copper, chromium, cobalt, molybdenum, nickel, other suitable constituent, or combinations thereof), a tantalum-based alloy (including, for example, tantalum and gold, copper, tungsten, platinum, tungsten, molybdenum, other suitable constituent, or combinations thereof), other aluminum-free pWFM, or combinations thereof. In some embodiments, nWFM has a work function value that is less than about 4.5 electron volts (eV), and pWFM has a work function value that is greater than or equal to about 4.5 eV. For example, nWFM has a work function value that is about 3.5 eV to about 4.4 eV, where such work function values are closer to a conduction band energy (e.g., 4.1 eV of Si or 3.8 eV of SiGe) of a semiconductor channel region than a valence band energy (e.g., 5.2 eV of Si or 4.8 eV of SiGe) of the semiconductor channel region, while pWFM has a work function value that is about 4.5 eV to about 5.5 eV, where such work function values are closer to the valence band energy of the semiconductor channel region than the conduction band energy of the semiconductor channel region. The present disclosure contemplates metal layer 154B including any material that exhibits a desired work function. In some embodiments, metal layer 154A and/or metal layer 154C include a material that exhibits a desired work function. For example, metal layer 154A and/or metal layer 154C include pWFM. In some embodiments, materials of metal layer 154A, metal layer 154B, metal layer 154C, and metal layer 154D are configured to provide metal gate layer 154 with a desired work function, and metal gate layer 154 can be referred to as a work function layer.

In FIG. 3E, a glue layer 156 is formed over substrate 105. Glue layer 156 has a substantially uniform thickness, such as a thickness T, and partially fills gate opening 145. Glue layer 156 is disposed on metal gate layer 154, and in the depicted embodiment, physically contacts metal layer 154D. In some embodiments, thickness T is about 20 Å to about 100 Å. Glue layer 156 includes a material that promotes adhesion between metal gate layer 154 (e.g., metal layer 154D) and a metal fill layer 158 of gate stack 150, which is subsequently formed and described below. In some embodiments, the material of glue layer 156 includes metal (for example, W, Al, Ta, Ti, Ni, Cu, Co, other suitable metal, or combinations thereof), metal oxides, metal nitrides, metal alloys, or combinations thereof. Glue layer 156 is formed by ALD, PVD, CVD, HDPCVD, MOCVD, RPCVD, PECVD, LPCVD, ALCVD, APCVD, plating, other suitable methods, or combinations thereof. In an example, glue layer 156 is a titanium nitride layer (e.g., a TiN layer) formed by ALD or CVD. In another example, glue layer 156 is a tantalum nitride layer (e.g., a TaN layer) formed by ALD or CVD. In yet another example, glue layer 156 is a cobalt layer (e.g., a Co layer) formed by ALD or CVD. In yet another example, glue layer 156 is a titanium silicon nitride layer (e.g., a TSN layer) formed by ALD or CVD. In some embodiments, the TSN layer may include alternatingly deposited TiN layers and silicon nitride layers (e.g., SiN layers), where the TiN layers and the SiN layers are so thin that the TiN layers and the SiN layers are indistinguishable and thus referred to as a TSN layer.

Glue layer 156 has residual tensile stress that causes glue layer 156 to warp, bend, neck, and/or bow as depicted, which correspondingly warps metal gate layer 154, gate dielectric layer 152, gate spacers 135, other layers of gate structure 125, or combinations thereof. For example, glue layer 156, as deposited, has a residual stress of about 1.0 Gigapascals (GPa) to about 3.0 GPa (i.e., a large residual tensile stress), which alters a profile of gate structure 125 and critical dimension of gate structure 125. In FIG. 3E, a line A and a line A' represent substantially vertical sidewalls of gate stack 150 (which interface with gate spacers 135) before forming glue layer 156 and having critical dimension CD defined therebetween. The residual tensile stress in glue layer 156 causes necking in a top portion of gate structure 125, which decreases its critical dimension, and bowing in a middle portion and/or a bottom portion of gate structure 125, which increases its critical dimension. For example, sidewalls of the top portion of gate structure 125 curve/bend inward and narrow gate opening 145 (i.e., a distance between sidewalls of gate stack 150 decreases, thereby decreasing a width of gate opening 145), and the sidewalls of the middle portion and/or the bottom portion of gate structure 125 curve/bend outward and widen gate opening 145 (i.e., a distance between sidewalls of gate stack 150 increases, thereby increasing the width of gate opening 145). In such embodiment, in response to the residual tensile stress of glue layer 156, sidewalls of gate stack 150 are curvilinear and have outwardly curving portions (i.e., those that curve/bend away from gate opening 145) and inwardly curving portions (i.e., those that curve/bend to gate opening 145). In some embodiments, gate structure 125 has a convex cross-sectional profile (i.e., a portion having a middle and ends, where a width of the middle is greater than widths of the ends).

In such embodiments, gate stack 150 has a non-uniform critical dimension. For example, gate stack 150 has a necking critical dimension $CD_N$ that that is less than critical dimension CD and a bowing critical dimension $CD_B$ that is greater than critical dimension CD. As deposited, glue layer 156 has been observed to cause necking critical dimensions $CD_N$ in gate stack 150 that are about 85% to about 90% less than critical dimension CD and bowing critical dimensions $CD_B$ in gate stack 150 that are about 30% to about 35% greater than critical dimension CD. In some embodiments, necking critical dimension $CD_N$ is about 20 Å to about 35 Å less than critical dimension CD. In some embodiments, bowing critical dimension $CD_B$ is about 20 Å to about 35 Å greater than critical dimension CD. Necking portions of gate stack 150 have a necking angle θ with respect to line A or line A' (i.e., an axis along the z-direction that represents a substantially vertical sidewall of gate stack 150 and/or gate structure 125 before depositing glue layer 156) and bowing portions of gate stack 150 have a bowing angle φ with respect to line A or line A'. As deposited, glue layer 156 has been observed to cause necking angles θ that are greater than about 5° and bowing angles φ that are greater than about 5°. In some embodiments, each layer of gate structure 125 (e.g., gate dielectric layer 152, metal gate layer 154, glue layer 156, gate spacers 135, or combinations thereof) can have necking portions (segments) with respective necking angles and/or bowing portions (segments) with respective bowing angles. As IC devices scale and device dimensions shrink, the warpage of gate structure 125 and/or gate stack 150 caused by stressed glue layer 156 and resulting critical dimension variances can significantly narrow gate opening 145 and prevent subsequently formed metal fill layer 158 from completely filling gate opening 145. This can lead to formation of seams and/or voids in gate stack 150 that can significantly degrade device performance and/or device integrity. For example, voids or seams in gate stack 150 may result in device 100 having performance characteristics that are different than prescribed by design specifications. In some embodiments, voids or seams in gate stack 150 may result in device 100 having performance characteristics that are unacceptable, which can lead to discarding of device 100.

Figures 4A, 4B, 5:
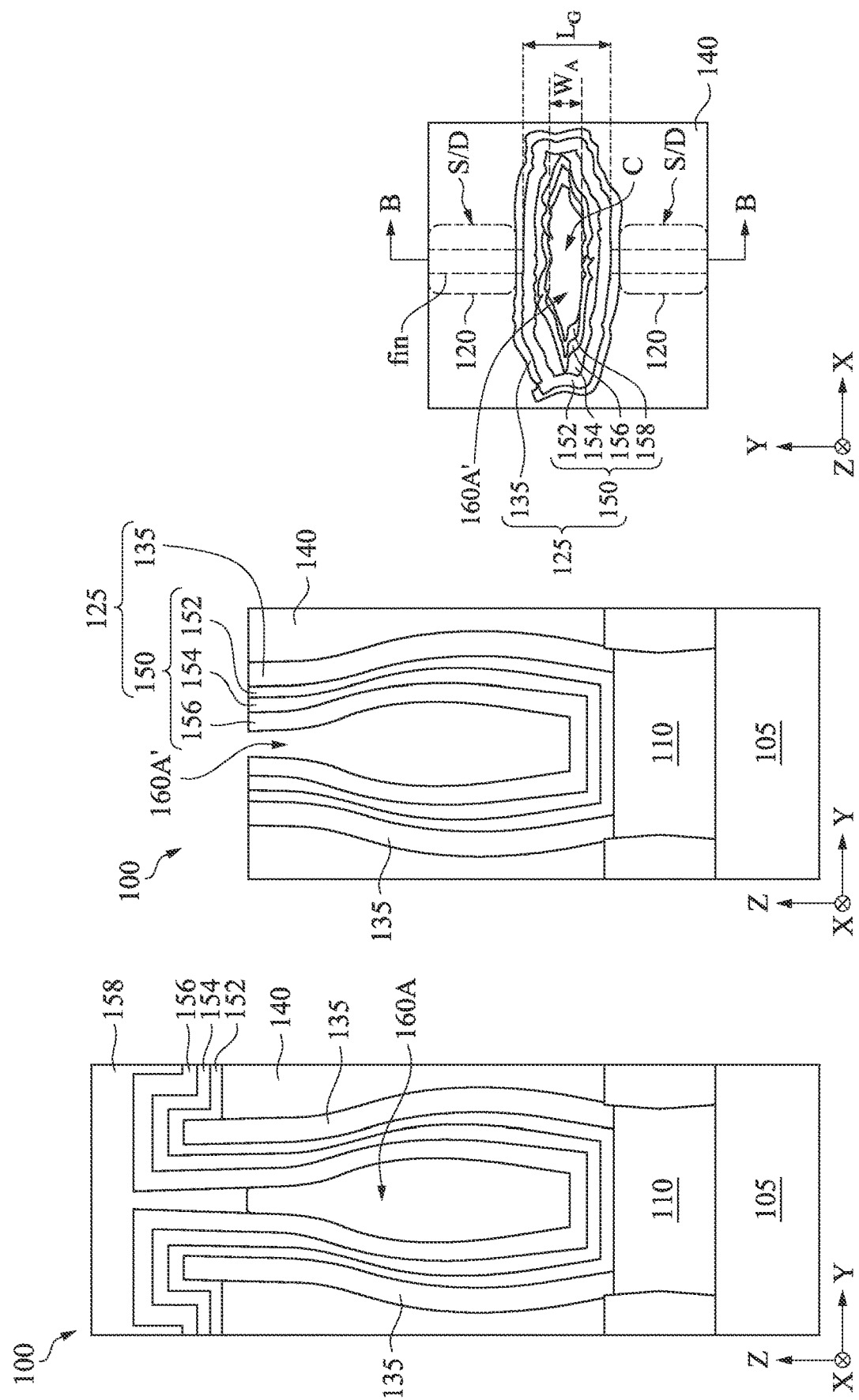
FIG. 4A and FIG. 4B are fragmentary cross-sectional views of a device, in portion or entirety, at various gate stack fabrication stages when a glue layer of a gate stack of the device is not stress-treated according to various aspects of the present disclosure.
FIG. 5 is a top view of the device, in portion or entirety, of FIG. 4B according to various aspects of the present disclosure.

FIG. 4A, FIG. 4B, and FIG. 5 illustrate seams and/or voids that may arise when a narrower width of gate opening 145 caused by warping, bending, necking, and/or bowing of gate structure 125 results in metal fill layer 158 plugging gate opening 145. FIG. 4A is a fragmentary cross-sectional view of device 100, in portion or entirety, after depositing metal fill layer 158, FIG. 4B is a fragmentary cross-sectional view of device 100, in portion or entirety, after a planarization process, and FIG. 5 is a top view of device 100 that corresponds with FIG. 4B according to various aspects of the present disclosure. FIG. 4B is taken along B—B of FIG. 5. In FIG. 4A, metal fill layer 158 fills a top of gate opening 145 before reaching and/or filling a middle and/or a bottom of gate opening 145, and a void 160A is formed in gate structure 125 between glue layer 156 and metal fill layer 158. In FIG. 4B and FIG. 5, the planarization process removes excess gate material from over a top surface of dielectric layer 140 to form gate stack 150. The planarization process also reduces a thickness of dielectric layer 140 and a height of gate structure 125 along the z-direction. In such embodiments, the planarization process may remove metal fill layer 158 and reach void 160A, thereby forming a seam 160A' in gate stack 150 that exposes glue layer 156. Seam 160A' is an unfilled portion of gate opening 145 and forms a gap or opening in gate stack 150. Seam 160A' has a width $W_A$ along the y-direction. In some embodiments, width $W_A$ is about 20 Å to about 110 Å.

FIG. 6A, FIG. 6B, and FIG. 7 illustrate seams and/or voids that may arise when a narrower width of gate opening 145 caused by warping, bending, necking, and/or bowing of gate structure 125 results in pinching off of metal fill layer 158 in gate opening 145. FIG. 6A is a fragmentary cross-sectional view of device 100, in portion or entirety, after depositing metal fill layer 158, FIG. 6B is a fragmentary cross-sectional view of device 100, in portion or entirety, after a planarization process, and FIG. 7 is a top view of device 100 that corresponds with FIG. 6B according to various aspects of the present disclosure. FIG. 6B is taken along B-B of FIG. 7. In FIG. 6A, metal fill layer 158 fills or closes (pinches) off a top of gate opening 145 before completely filling gate opening 145, and a void 160B is formed in gate structure 125. Void 160B is an unfilled portion of gate opening 145 that is within metal fill layer 158. In FIG. 6B and FIG. 7, the planarization process removes excess gate material from over a top surface of dielectric layer 140 to form gate stack 150. The planarization process also reduces a thickness of dielectric layer 140 and a height of gate structure 125 along the z-direction. In such embodiments, the planarization process may remove metal fill layer 158 and reach void 160B, thereby forming a seam 160B' in gate stack 150. Seam 160B' is an unfilled portion of gate opening 145 and forms a gap or opening in gate stack 150. Seam 160B' has a width $W_B$ along the y-direction. In some embodiments, width $W_B$ is about 20 Å to about 110 Å. In the depicted embodiment, width $W_B$ of seam 160B' (between sidewall portions of metal fill layer 158) is less than width $W_A$ of seam 160A' (between sidewall portions of glue layer 156).

As device 100 undergoes further processing, seam 160A' and/or seam 160B' have been observed to provide paths for chemicals and/or impurities to damage gate stack 150 and/or channel region 110. For example, chemicals and/or impurities entering seam 160A' and/or seam 160B' during subsequent processing may alter physical and/or electrical characteristics of metal fill layer 158, glue layer 156, metal gate layer 154, gate dielectric layer 152, interfacial layer 152A, or combinations thereof. In another example, during a subsequent etching process, etchant may enter seam 160A' and/or seam 160B' and undesirably remove portions of gate stack 150 and, in some embodiments, expose channel region 110. In another example, chemicals and/or impurities entering seam 160A' and/or seam 160B' during subsequent processing may alter physical and/or electrical characteristics of channel region 110, particularly when channel region 110 is exposed by unintentional removal of portions of gate stack 150. In some embodiments, damage to gate stack 150 and/or channel region 110 caused by chemicals and/or impurities entering seam 160A' and/or seam 160B' may render device 100 inoperable.

The present disclosure addresses these challenges and eliminates or significantly reduces voids and/or seams in gate stack 150 by reducing stress in glue layer 156 and correspondingly eliminating or reducing warpage of gate structure 125 that may cause such voids and/or seams. For example, returning to FIGS. 3A-3I, in FIG. 3F and FIG. 3G, a stress reduction treatment 170 is performed on glue layer 156 (FIG. 3F), thereby providing stress-treated glue layer 156' (FIG. 3G). Stress reduction treatment 170 alters properties and/or characteristics of glue layer 156 to reduce its residual stress, such that stress-treated glue layer 156' has a residual stress that is less than a residual stress of glue layer 156. For example, stress reduction treatment 170 converts residual tensile stress (e.g., greater than 0 GPa) to residual compressive stress (e.g., less than 0 Pa), where a residual stress of 0 GPa indicates a neutralized stress or stress-free metal layer. In some embodiments, glue layer 156 has a residual stress of about 1.0 GPa to about 3 GPa (i.e., a residual tensile stress), and stress-treated glue layer 156' has a residual stress of about −2.5 GPa to about 0.8 GPa (i.e., a residual compressive stress, a neutralized stress, or a negligible residual tensile stress). Stress-treated glue layer 156' having a residual stress of about −2.5 GPa to about 0.8 GPa exhibits minimal to no warping, bending, necking, and/or bowing, which correspondingly eliminates or significantly reduces warping of gate structure 125 and formation of voids and/or seams in gate stack 150. In contrast, glue layers having a residual stress greater than about 0.8 GPa or less than about −2.5 GPa may still exhibit undesired warping, bending, necking, and/or bowing, which can cause warping of gate structure 125 that can lead to formation of voids and/or seams in gate stack 150.

Stress reduction treatment 170 reduces bowing, necking, and/or other profile variations in gate structure 125 and/or gate stack 150. For example, gate stack 150 and gate spacers 135 have substantially vertical sidewalls after stress reduction treatment 170, and minimal (to no) bowing and/or necking is observed in gate structure 125 and/or gate stack 150 after stress reduction treatment 170. In embodiments where necking portions and/or bowing are observed in gate structure 125 and/or gate stack 150 after stress reduction treatment 170, necking critical dimensions $CD_N$ are about 0% to about 15% less than critical dimension CD and bowing critical dimensions $CD_B$ are about 0% to about 5% greater than critical dimension CD. In other words, differences between critical dimension CD and necking critical dimensions $CD_N$ and/or bowing critical dimensions $CD_B$ in gate stack 150 are significantly smaller after stress reduction treatment 170. In some embodiments, any observable difference between necking critical dimension $CD_N$ and critical dimension CD is less than about 10 Å. In some embodiments, any observable difference between bowing critical dimension $CD_B$ and critical dimension CD is less than about 10 Å. Further, any observed necking angles θ are less than about 5° and any observed bowing angles φ are less than about 5°. In some embodiments, observed necking angles θ are about 2° to about 4° (e.g., 3.5°). In some embodiments, observed bowing angles φ are about 2° to about 4° (e.g., 3.5°). Accordingly, gate stack 150 having stress-treated glue layer 156' has critical dimension CD that is substantially the same from top to bottom (i.e., a substantially uniform critical dimension). In such embodiments, gate structure 125 and/or gate stack 150 has a rectangular cross-sectional profile. In some embodiments, where gate structure 125 and/or gate stack 150 exhibit slight necking and/or bowing, gate structure 125 and/or gate stack 150 may have a concave cross-sectional profile (i.e., a portion having a middle and ends, where a width of the middle is less than widths of the ends). However, it is noted that residual stress in stress-treated glue layer 156' that is less than about −2.5 GPa (i.e., larger compressive residual stress) may induce necking that narrows gate opening 145 sufficiently to cause undesired void and/or seam formation. Further, gate structures and/or gate stacks having necking critical dimensions $CD_N$ more than 15% less than critical dimension CD, bowing critical dimensions $CD_B$ more than 5% greater than critical dimension CD, critical dimension differences that are greater than 10 Å, necking angles θ that are greater than about 5°, bowing angles φ that are greater than about 5°, or combinations thereof may still exhibit undesired warping, bending, necking, and/or bowing.

In some embodiments, stress reduction treatment 170 decreases a d-spacing (i.e., a distance between parallel crystal planes in a material) in glue layer 156 to reduce its residual stress. For example, glue layer 156 has a d-spacing that is greater than about 2.105 Å, stress-treated glue layer 156' has a d-spacing that is less than or equal to about 2.105 Å, and stress-treated glue layer 156' has a residual stress that is less than a residual stress of glue layer 156 (i.e., reducing d-spacing reduces residual stress). In some embodiments, stress reduction treatment 170 increases a ratio of titanium to nitrogen (i.e., a Ti/N ratio) in glue layer 156 to reduce its residual stress. For example, glue layer 156 has a Ti/N ratio that is less than about 1.0 (e.g., about 0.8 to about 1.0), stress-treated glue layer 156' has an Ti/N ratio that is greater than about 1.0 (e.g., about 1.3 to about 2.0), and stress-treated glue layer 156' has a residual stress that is less than a residual stress of glue layer 156. In some embodiments, stress reduction treatment 170 incorporates and/or increases an amount of non-metal species in glue layer 156 to reduce its residual stress. For example, glue layer 156 is substantially free of a non-metal species (e.g., argon (Ar), oxygen (O), fluorine (F), hydrogen (H), other suitable non-metal species, or combinations thereof), stress-treated glue layer 156' includes the non-metal species (e.g., Ar, O, F, H, other non-metal species, or combinations thereof), and stress-treated glue layer 156' has a residual stress that is less than a residual stress of glue layer 156 (i.e., increasing an amount of non-metal species reduces residual stress). In another example, glue layer 156 includes a first concentration (e.g., a negligible amount) of a non-metal species, stress-treated glue layer 156' includes a second concentration of the non-metal species that is greater than the first concentration, and stress-treated glue layer 156' has a residual stress that is less than a residual stress of glue layer 156.

In some embodiments, stress reduction treatment 170 is an ion implantation process that bombards glue layer 156 with a dopant species (also referred to as implant species and/or ions) to alter its stress properties. For example, Ar, N, O, F, other suitable dopant species, or combinations thereof are implanted in glue layer 156 using an implant energy of about 0.5 kiloelectronvolts (keV) to about 5 keV and an implant dose of about $1 \times 10^{14}$ cm$^{-3}$ to about $1 \times 10^{16}$ cm$^{-3}$. A tilt angle of about 5° to about 15° can be implemented to implant the dopant species in glue layer 156, where the tilt angle is between an incident ion beam direction and a normal direction of substrate 105. To ensure that stress-treated glue layer 156' has a sufficiently low residual stress (e.g., less than about 0.8 GPa) to eliminate (or significantly reduce) bowing and/or necking of gate structure 125 and/or gate stack 150, the ion implantation process is configured to provide stress-treated glue layer 156' with a concentration of non-metal dopant species (e.g., Ar, N, O, F, other non-metal dopant species, or combinations thereof) that is greater than about $9 \times 10^{16}$ cm$^{-3}$. The dopant species penetrate glue layer 156 to a depth D in stress-treated glue layer 156' (FIG. 3G). The ion implantation process is configured to implant dopant species deep enough in glue layer 156 to adequately alter properties and/or characteristics of glue layer 156 and reduce its residual stress while ensuring that dopant species do not reach (or only negligible amounts of dopant species reach) underlying gate layers, such as metal gate layer 154 and/or gate dielectric layer 152. Depth D is thus less than or equal to thickness T. In some embodiments, depth D is about 20 Å to about 100 Å. In some embodiments, bombarding glue layer 156 with dopant species breaks and/or modifies a lattice structure of glue layer 156 in a manner that can reduce strain/stress. In such embodiments, glue layer 156 and stress-treated glue layer 156' have different lattice structures (e.g., stress-treated glue layer 156' has a more relaxed lattice structure and/or smaller d-spacing) and different residual stress properties (e.g., stress-treated glue layer 156' exhibits less residual stress).

In some embodiments, stress reduction treatment 170 is an argon ion implantation process that introduces argon into glue layer 156. In such embodiments, a flow rate of an argon-containing gas (e.g., Ar) into the process chamber during the ion implantation process is about 1,000 standard cubic centimeters per minute (sccm) to about 5,000 sccm. In some embodiments, stress reduction treatment 170 is a nitrogen ion implantation process that introduces nitrogen into glue layer 156. In such embodiments, a flow rate of a nitrogen-containing gas (e.g., $N_2$) into the process chamber during the ion implantation process is about 1,000 sccm to about 2,000 sccm. In some embodiments, stress reduction treatment 170 is an oxygen ion implantation process that introduces oxygen into glue layer 156. In such embodiments a flow rate of an oxygen-containing gas (e.g., $O_2$) into the process chamber during the ion implantation process is about 1,000 sccm to about 2,000 sccm. In some embodiments, stress reduction treatment 170 is a fluorine ion implantation process that introduces fluorine into glue layer 156. In such embodiments, a flow rate of a fluorine-containing gas (e.g., $F_2$) into the process chamber during the ion implantation process is about 500 sccm to about 1,500 sccm. Various ion implantation parameters can be tuned to alter stress properties of glue layer 156 and provide stress-treated glue layer 156' with desired stress properties (e.g., residual stress less than about 0.8 GPa), such as implant dopant species, implant energy (e.g., ion beam energy), implant dose, implant angle (e.g., tilt angle), implant gas composition (e.g., type of dopant source gas and/or type of carrier gas), dopant gas flow rate, carrier gas flow rate, implant temperature, implant time, other suitable ion implantation parameters, or combinations thereof. For example, implant energies, implant doses, tilt angles, and dopant gas flow rates that are greater than upper ends of the examples provided may cause defects (e.g., physical defects, such as pit defects, and/or electrical defects) in and/or undesirably alter properties/characteristics (e.g., undesired threshold voltage shifts) of stress-treated glue layer 156', metal gate layer 154, gate dielectric layer 152, interfacial layer 152A, or combinations thereof, while those that are less than lower ends of the examples provided will not reduce residual stress enough in glue layer 156 to eliminate or significantly reduce warping of gate structure 125 (i.e., stress-treated glue layer 156' may still have a residual tensile stress that is too high (e.g., greater than 0.8 GPa)). In some embodiments, values of implant energies, implant doses, tilt angles, and dopant gas flow rates depend on a thickness of glue layer 156.

In some embodiments, stress reduction treatment 170 is a thermal process, such as an annealing process, that heats glue layer 156 in a gas atmosphere to alter its stress properties. For example, glue layer 156 is annealed at a temperature of about 300° C. to about 500° C. in a process chamber that includes an oxygen-containing gas (e.g., $O_2$) and/or a hydrogen-containing gas (e.g., $H_2$). In such embodiments, oxygen and/or hydrogen are introduced into glue layer 156 during stress reduction treatment 170 and stress-treated glue layer 156' includes oxygen and/or hydrogen. In other words, glue layer 156 undergoes an oxidation process and/or a hydrogenation process. In some embodiments, an oxygen concentration in stress-treated glue layer 156' after an $O_2$ anneal is greater than about b $9 \times 10^{16}$ cm$^{-3}$. In some embodiments, a hydrogen concentration in stress-treated glue layer 156' after an $H_2$ anneal is greater than about $9 \times 10^{16}$ cm$^{-3}$. In some embodiments, a flow rate of the gas (e.g., $O_2$ and/or $H_2$) into the process chamber during the annealing process is about 100 sccm to about 200 sccm. In some embodiments, the annealing process is performed at a pressure of about 3 Torr to about 50 Torr. In some embodiments, the annealing process is a rapid thermal anneal (RTA). Various annealing parameters can be tuned to alter stress properties of glue layer 156 and provide stress-treated glue layer 156' with desired stress properties (e.g., residual stress less than about 0.8 GPa), such as anneal temperature, anneal pressure, anneal time, anneal gas composition, anneal gas flow rate, other suitable anneal parameters, or combinations thereof. For example, anneal temperatures, anneal gas flow rates, and anneal pressures that are greater than upper ends of the examples provided may alter properties of glue layer 156, metal gate layer 154, gate dielectric layer 152, interfacial layer 152A, or combinations thereof in ways that cause undesired threshold voltage shifts in device 100, while those that are less than lower ends of the examples provided will not reduce residual stress enough to eliminate or significantly reduce warping of gate structure 125. The present disclosure also contemplates annealing glue layer 156 in other gas environments, such that stress-treated glue layer 156' may include other constituents other than or in addition to oxygen and/or hydrogen depending on anneal gas composition.

In embodiments where glue layer 156 is subjected to an oxygen anneal (i.e., in a process chamber that includes an oxygen-containing gas), device 100 may be subjected to a wet clean process before the oxygen anneal. For example, an ozonated deionized water ($DIO_3$) clean process may be performed on glue layer 156 before the oxygen anneal. In such embodiments, a $DIO_3$ solution having an ozone concentration of about 30 ppm to about 100 ppm may be applied to glue layer 156 while a wafer having device 100 formed thereon is spun at a speed of about 240 rotations per minute (rpm) to about 500 rpm.

Figure 3H:
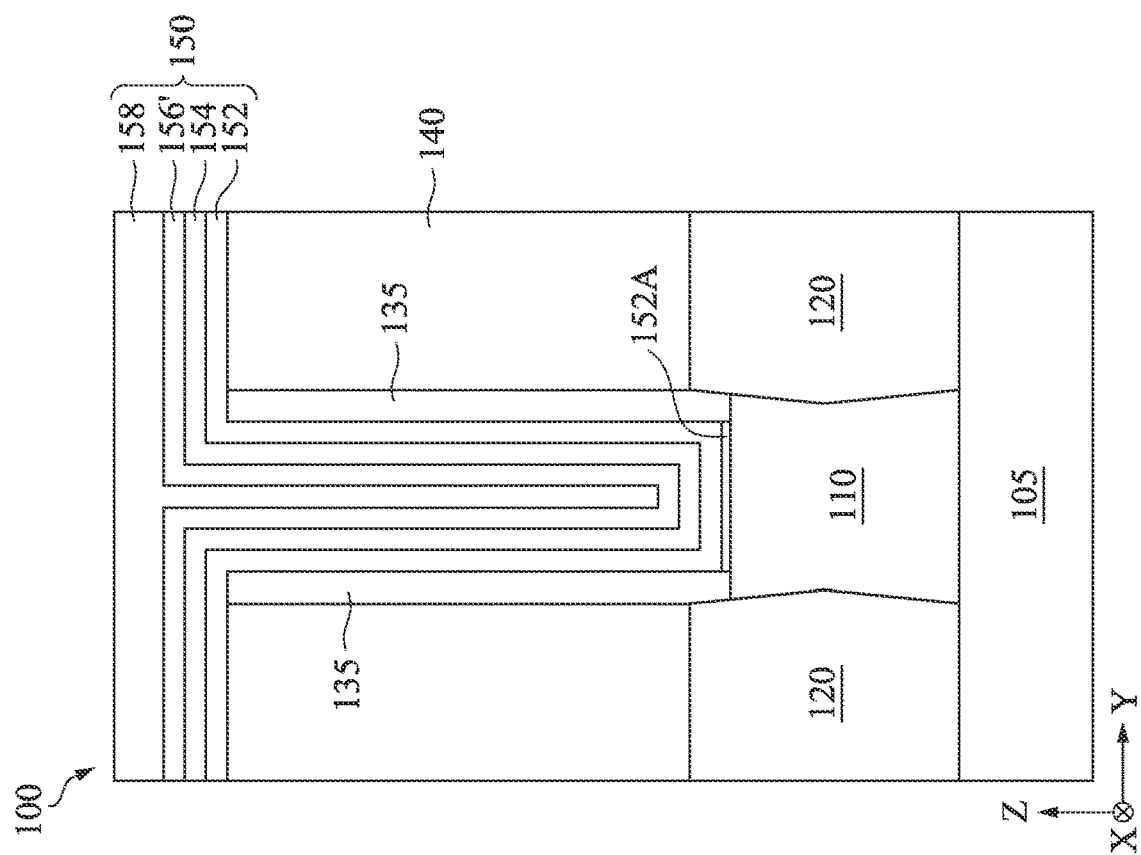
Figure 3G:
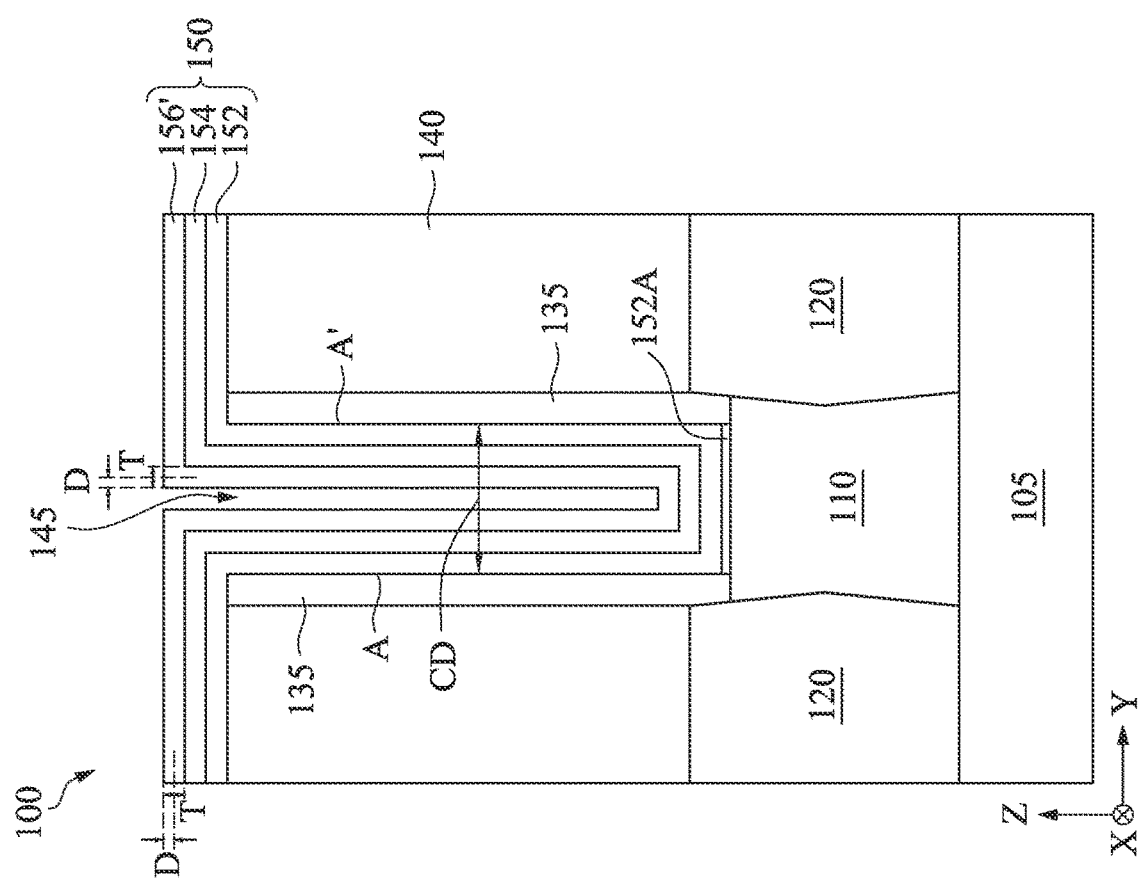

In FIG. 3H, metal fill (or bulk) layer 158 is formed over substrate 105. Metal fill layer 158 is disposed on stress-treated glue layer 156' and fills a remainder of gate opening 145. In some embodiments, metal fill layer 158 has a thickness of about 1,500 Å to about 3,000 Å. Because stress reduction treatment 170 provides stress-treated glue layer 156', gate structure 125 has minimal to no warpage, a width of gate opening 145 is substantially uniform along a height of gate structure 125, and metal fill layer 158 can completely fill the remainder of gate opening 145 without a void forming in gate stack 150. For example, the substantially uniform width of gate opening 145 reduces likelihood of metal fill layer 158 plugging or pinching off gate opening 145 before filling. Metal fill layer 158 includes a suitable conductive material, such as Al, W, Cu, other metals, metal oxide, metal nitride, other suitable conductive material, or combinations thereof. Metal fill layer 158 is formed by ALD, PVD, CVD, HDPCVD, MOCVD, RPCVD, PECVD, LPCVD, ALCVD, APCVD, plating, other suitable methods, or combinations thereof. In the depicted embodiment, metal fill layer 158 is a tungsten layer formed by PVD or CVD.

Figure 3I:
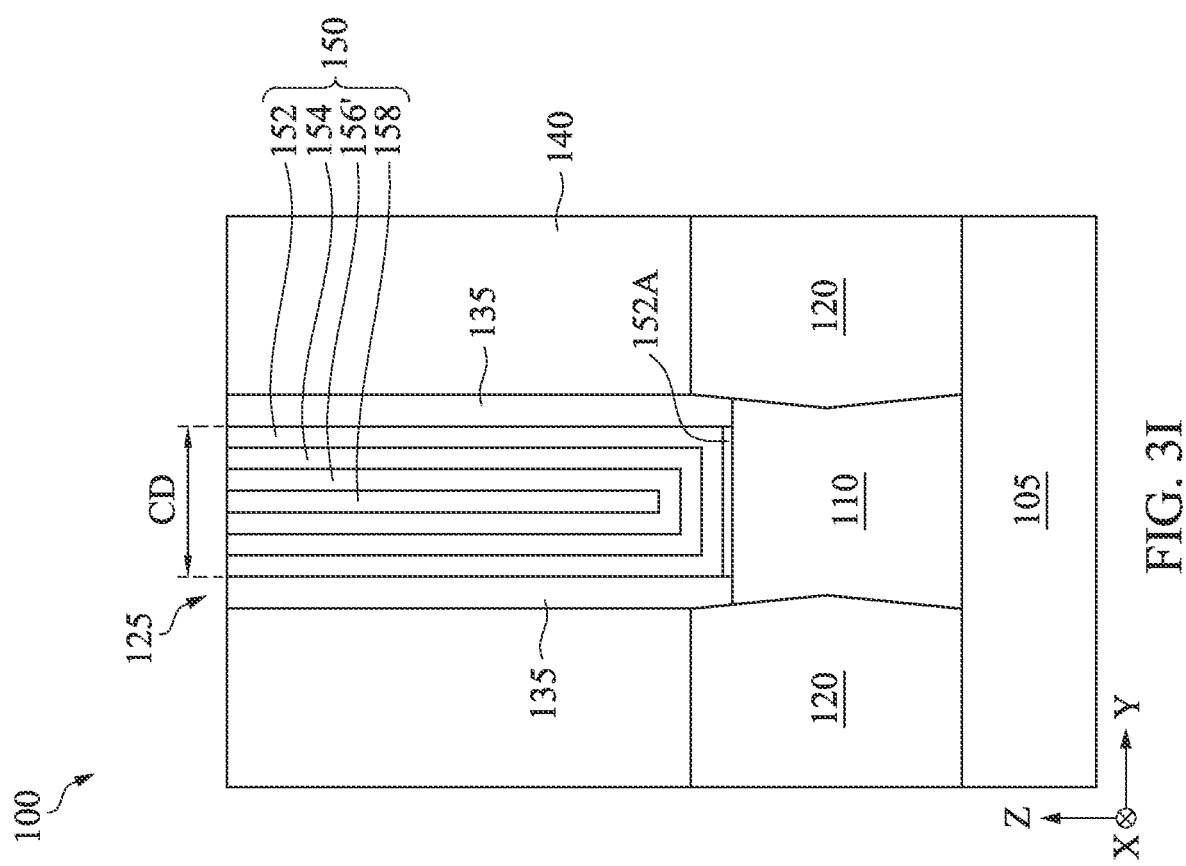

Turning to FIG. 3I, a planarization process is performed to remove excess gate materials from device 100. For example, a CMP process is performed until a top surface of dielectric layer 140 is reached (exposed). In some embodiments, CMP process is continued and reduces a thickness of dielectric layer 140, and correspondingly, a height of gate structure 125. In the depicted embodiment, a top of gate structure 125 is substantially planar with a top of dielectric layer 140 after the CMP process, and remainders of the gate materials, which fill gate opening 145, form gate stack 150 of gate structure 125. Gate stack 150 includes a gate dielectric (e.g., interfacial layer 152A and gate dielectric layer 152) and a gate electrode (e.g., metal gate layer 154, stress-treated glue layer 156', and metal fill layer 158). Where gate dielectric layer 152 is a high-k dielectric layer, gate stack 150 can be referred to as a high-k/metal gate. Because stress reduction treatment 170 is performed to provide stress-treated glue layer 156' before forming metal fill layer 158, gate structure 125 has minimal to no warpage, and metal fill layer 158 can completely fill the remainder of gate opening 145 without forming a void in gate stack 150. Consequently, gate stack 150 does not have any seams therein, such as seam 160A' and/or seam 160B' (which, as described above, occur when a void is formed in gate stack 150 because metal fill layer 158 insufficiently fills the remainder of gate opening 145 because of the warped profile of gate structure 125 caused by residual tensile stress of glue layer 156). In some embodiments, a negligible seam may form in gate stack 150, such as a seam having a width that is less than about 4 Å. Seams less than about 4 Å rarely result in damage to gate stack 150 and/or channel region 110, such as that described above with respect to seam 160A' and/or seam 160B'. Gate stacks, such as gate stack 150, having negligible seams (i.e., seams having widths less than about 4 Å) are thus considered seam-free for purposes of the present disclosure.

Figure 10:
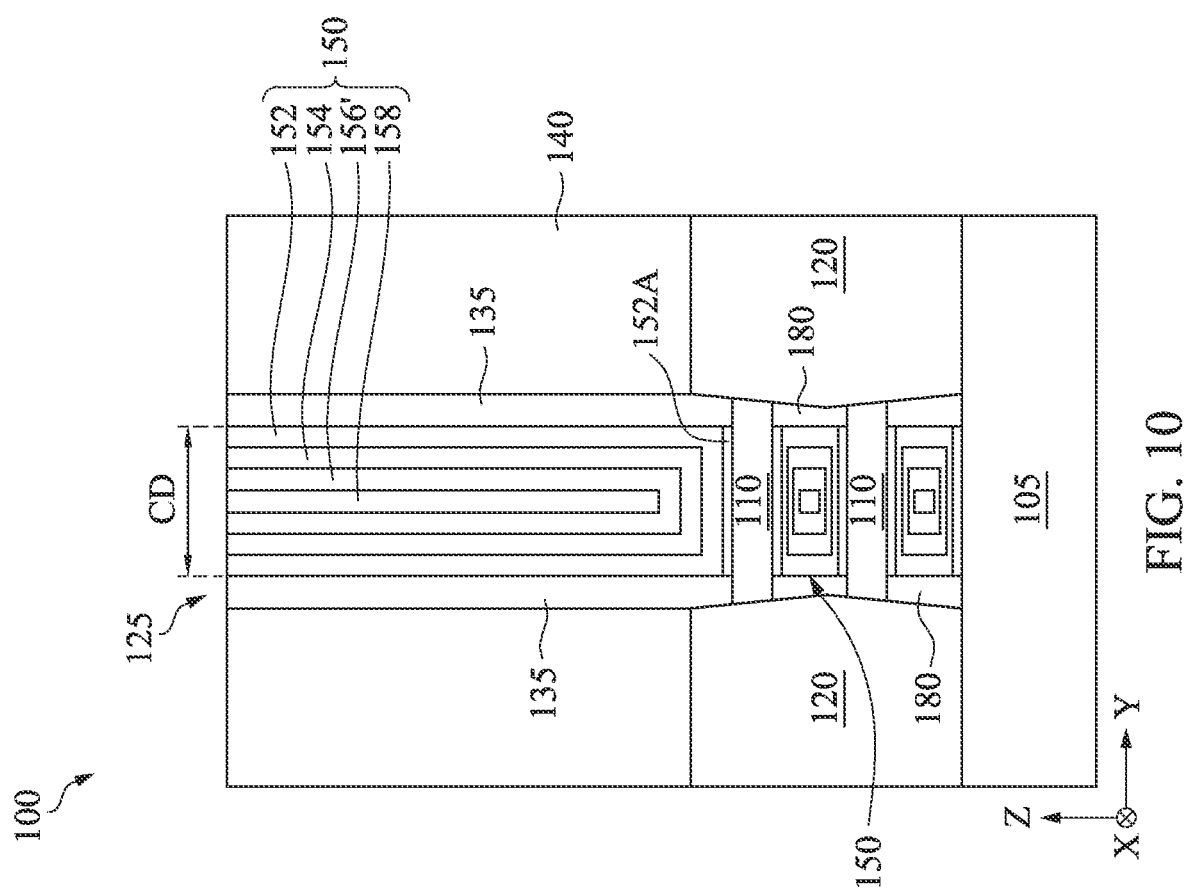
FIG. 10 is a fragmentary cross-sectional view of another device, in portion or entirety, having a gate stack fabricated using the gate stack fabrication stages of FIGS. 3A-3I or FIGS. 8A-8G according to various aspects of the present disclosure.

In some embodiments, device 100 is a transistor that includes a channel (e.g., channel region 110), source/drains (e.g., epitaxial source/drains 120), and a gate (e.g., gate structure 125 having gate spacers 135 disposed along sidewalls of gate stack 150). The gate engages the channel defined between the source/drains, and current can flow between the source/drains (e.g., between source and drain or vice versa) during operation. In some embodiments, device 100 is a FinFET, channel region 110 is a portion of a semiconductor fin extending from substrate 105, gate stack 150 is on a top of the semiconductor fin (and thus channel region 110) in the Y-Z plane, and gate stack 150 wraps the semiconductor fin (and thus channel region 110) in the X-Z plane, such as in FIG. 1 (i.e., gate stack 150 is disposed on a top and sidewalls of the semiconductor fin). In some embodiments, device 100 is a GAA transistor, such as depicted in FIG. 10. In FIG. 10, channel region 110 is at least one semiconductor layer (i.e., a channel layer) suspended over substrate 105, gate stack 150 is on a top and a bottom of the at least one semiconductor layer (and thus channel region 110) in the Y-Z plane (i.e., gate stack 150 is also between channel region 110 and substrate 105), and gate stack 150 surrounds the at least one semiconductor layer (and thus channel region 110) in the X-Z plane (i.e., gate stack 150 is disposed on a top, a bottom, and sidewalls of the at least one semiconductor layer). In such embodiments, inner spacers 180 are disposed between gate stack 150 and epitaxial source/drains 120. In such embodiments, before forming gate stack 150 in gate opening 145, a channel release process is performed to provide channel region 110 with at least one semiconductor layer suspended over substrate 105 (i.e., the semiconductor layer does not physically contact substrate 105 after the channel release process). For example, where gate opening 145 exposes a semiconductor layer stack having first semiconductor layers (e.g., silicon germanium layers) and second semiconductor layers (e.g., silicon layers), the first semiconductor layers are selectively removed to form air gaps between the second semiconductor layers and between the second semiconductor layers and substrate 105, thereby suspending the second semiconductor layers over substrate 105. The second semiconductor layers are vertically stacked along the z-direction and provide channel region 110 with one or more channels through which current can flow between epitaxial source/drains 120. In some embodiments, an etching process is performed to selectively etch the first semiconductor layers with minimal (to no) etching of the second semiconductor layers, substrate 105, gate spacers 135, dielectric layer 140, and/or inner spacers. In some embodiments, an etchant is selected for the etch process that etches silicon germanium (i.e., the first semiconductor layers) at a higher rate than silicon (i.e., the second semiconductor layers and substrate 105) and dielectric materials (i.e., gate spacers 135, dielectric layer 140, and/or inner spacers) (i.e., the etchant has a high etch selectivity with respect to silicon germanium). The etching process is a dry etch, a wet etch, other suitable etching process, or combinations thereof. In some embodiments, before performing the etching process, an oxidation process can be implemented to convert the first semiconductor layers into silicon germanium oxide features, where the etching process then removes the silicon germanium oxide features. In some embodiments, during and/or after removing the first semiconductor layers, an etching process is performed to modify a profile of the second semiconductor layers to achieve target dimensions and/or target shapes for channel region(s) 110.

In some embodiments, fabrication of device 100 can proceed with forming various contacts to facilitate operation of device 100. For example, one or more dielectric layers, similar to dielectric layer 140, can be formed over gate structure 125 (including gate stack 150) and dielectric layer 140. Contacts can then be formed in dielectric layer 140 and/or dielectric layers disposed over dielectric layer 140. For example, contacts are respectively formed that physically and/or electrically couple with gate stack 150 and one or both of epitaxial source/drains 120 of device 100. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some embodiments, dielectric layers disposed over dielectric layer 140 and the contacts (for example, the gate contact and the source/drain contacts extending through dielectric layer 140 and/or dielectric layers disposed thereof) are a portion of the MLI feature disposed over substrate 105, as described above. The MLI feature can include a combination of metal layers and dielectric layers configured to form vertical interconnect features, such as contacts and/or vias, and/or horizontal interconnect features, such as lines. The various conductive features include materials similar to the contacts. In some embodiments, a damascene process and/or dual damascene process is used to form the MLI feature.

FIGS. 8A-8G are fragmentary diagrammatic views of a device 200, in portion or entirety, at various fabrication stages (such as those associated with method 50 in FIG. 2) according to various aspects of the present disclosure. Device 200 may be included in a microprocessor, a memory, and/or other integrated circuit device. Device 200 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIGS. 8A-8G have been simplified for the sake of clarity to better understand the inventive concepts of the present disclosure. Additional features can be added in device 200, and some of the features described below can be replaced, modified, or eliminated in other embodiments of device 200.

Fabrication of device 200 in FIGS. 8A-8G is similar in many respects to fabrication of device 200 in FIGS. 3A-3I, except fabrication of device 200 forms a stress-treated multilayer glue layer 256' instead of stress-treated glue layer 156'. For example, fabrication begins with receiving a device precursor including, for example, substrate 105, channel region 110, epitaxial source/drains 120, gate structure 125 (including dummy gate 130 and gate spacers 135), and dielectric layer 140 (FIG. 8A, fabrication of which is similar to that described with reference to FIG. 3A), removing dummy gate 130 to form gate opening 145 (FIG. 8B, fabrication of which is similar to that described with reference to FIG. 3B), forming gate dielectric layer 152 that partially fills gate opening 145 (FIG. 8C, fabrication of which is similar to that described with reference to FIG. 3C), and forming metal gate layer 154 over gate dielectric layer 152 (FIG. 8D, fabrication of which is similar to that described with reference to FIG. 3D).

Figure 8A:
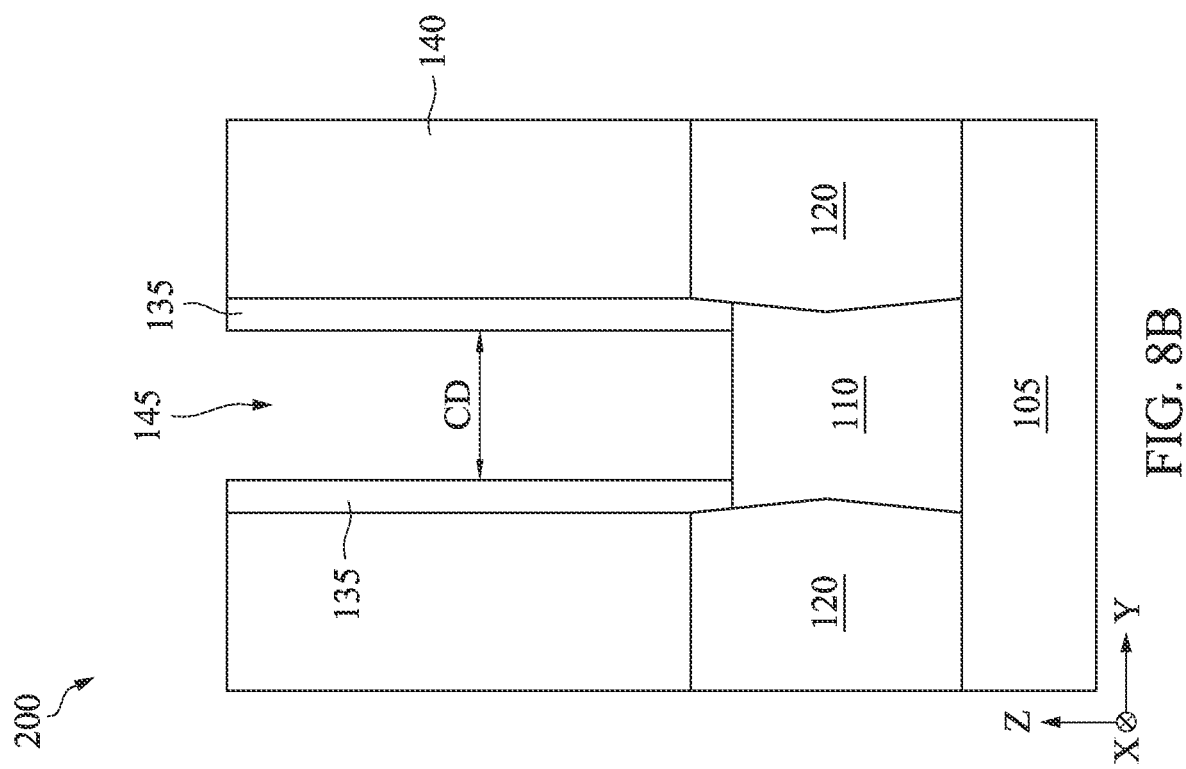
FIGS. 8A-8G are fragmentary cross-sectional views of another device, in portion or entirety, at various gate stack fabrication stages when a glue layer of a gate stack of the device is stress-treated according to various aspects of the present disclosure.
Figure 8B:
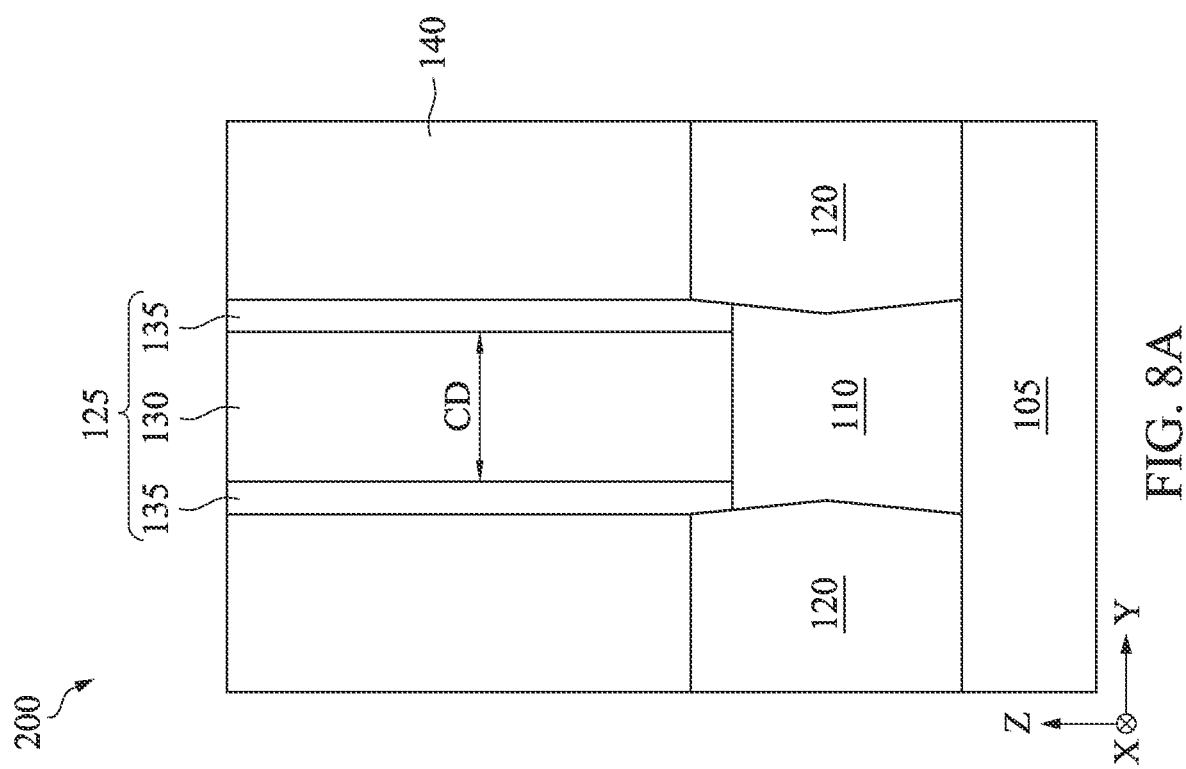
Figure 8D:
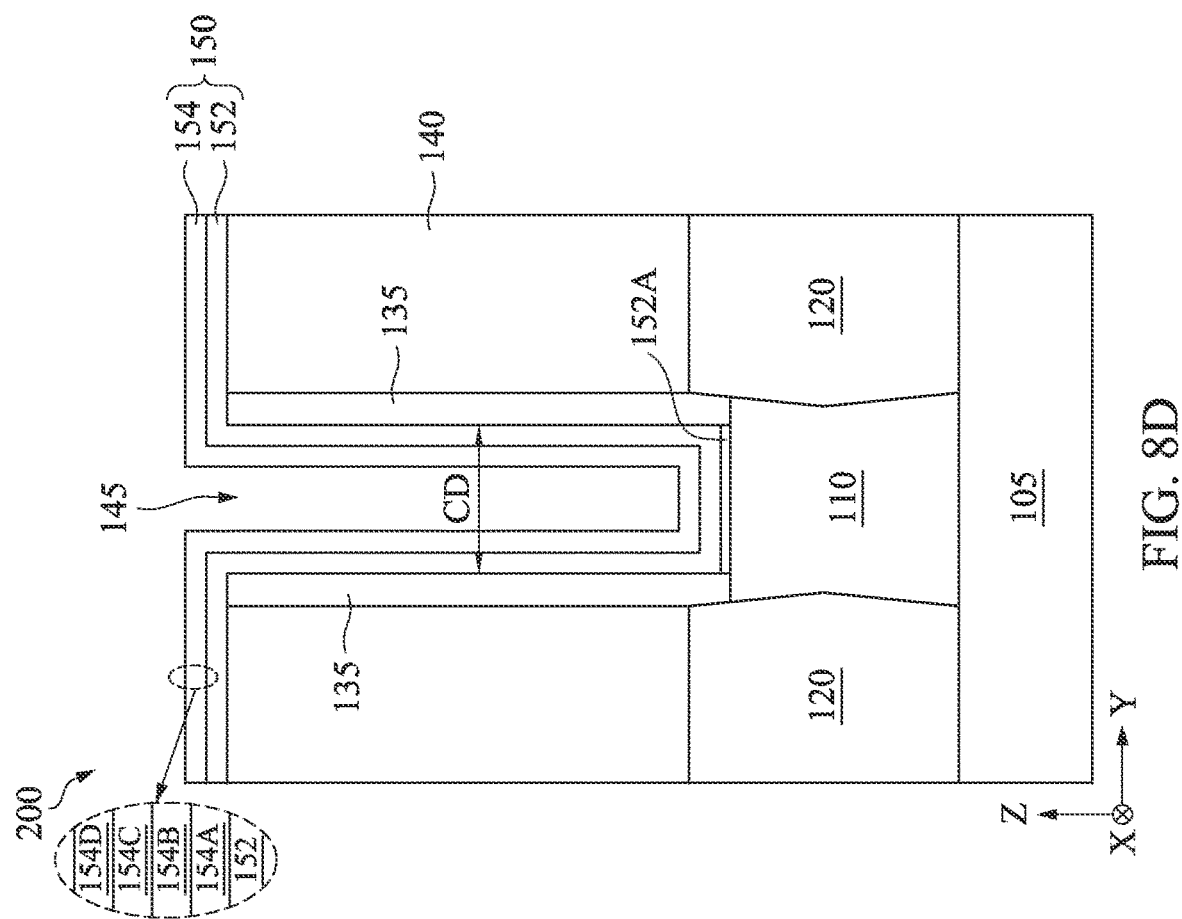
Figure 8C:
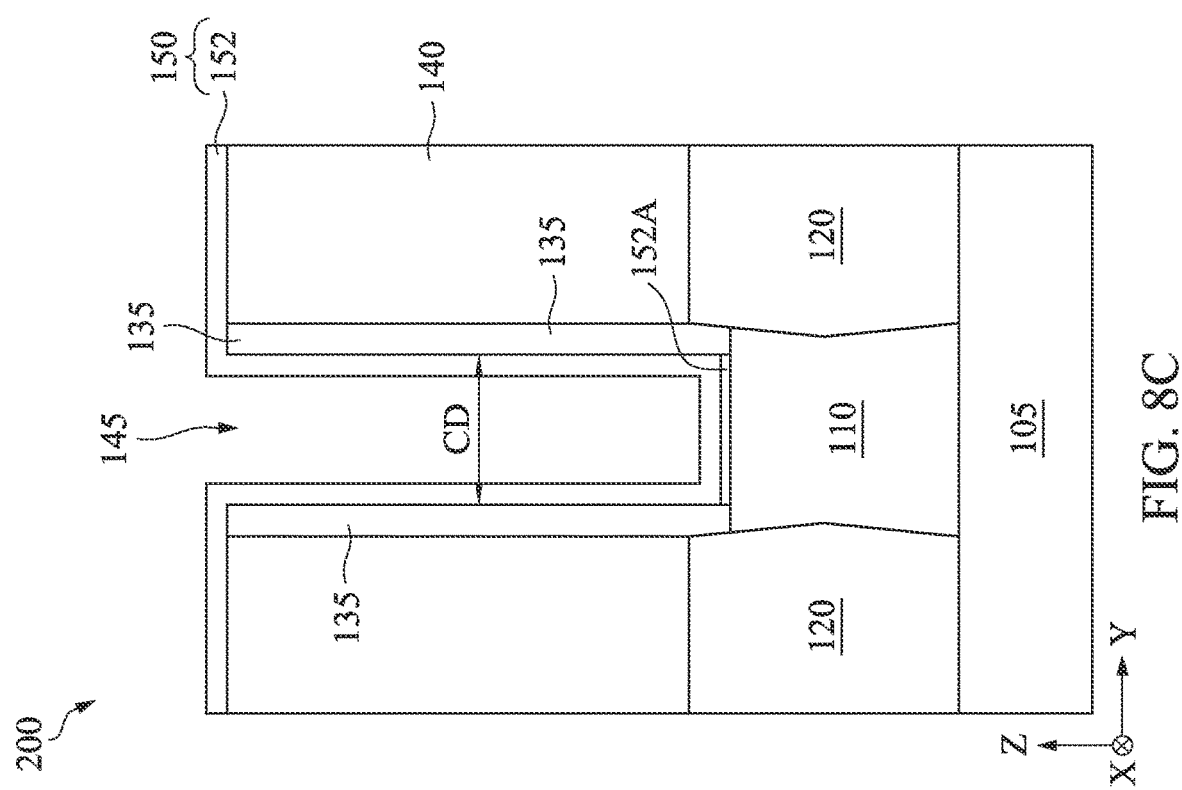
Figure 8F:
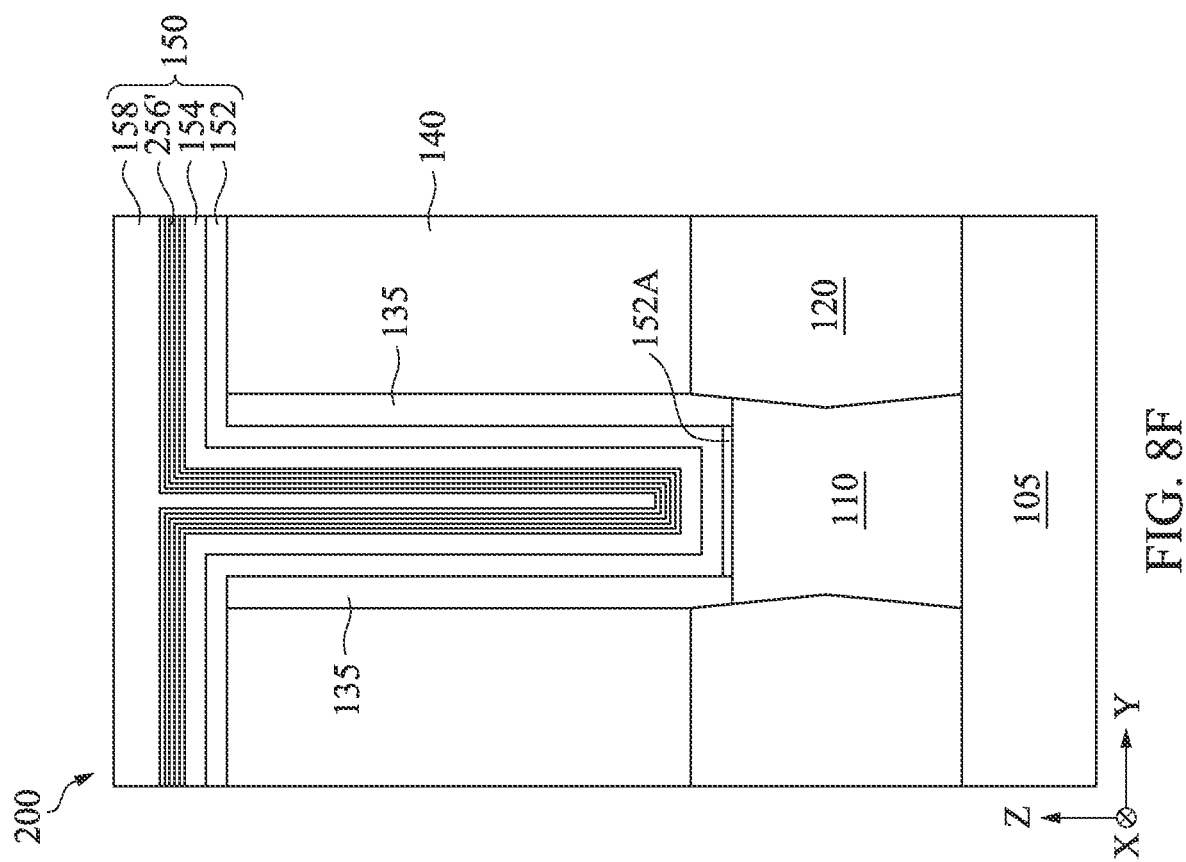
Figure 8E:
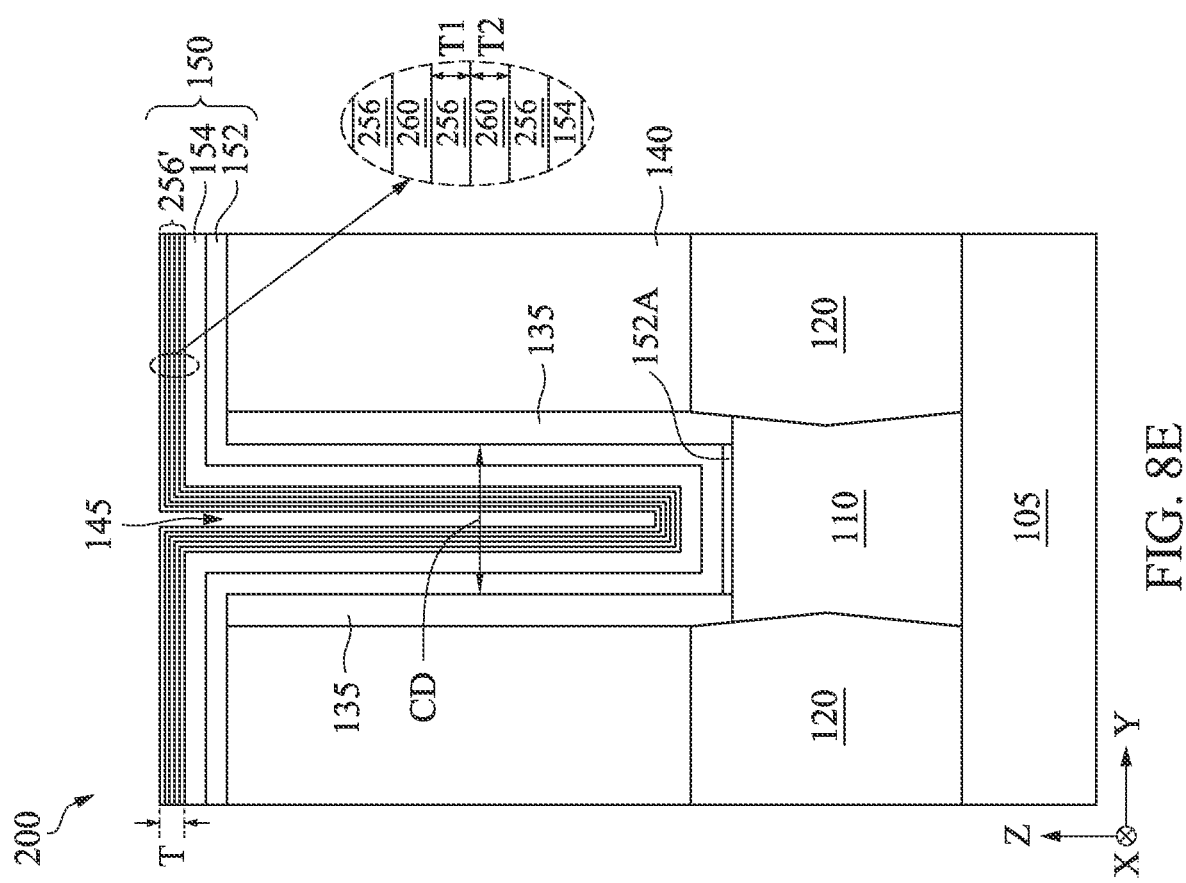

Then, turning to FIG. 8E, instead of forming a single glue layer, such as glue layer 156, and performing stress reduction treatment 170 to provide stress-treated glue layer 156', fabrication of device 200 proceeds with forming stress-treated multilayer glue layer 256' having thickness T. Stress-treated multilayer glue layer 256' partially fills gate opening 145. Similar to stress-treated glue layer 156', stress-treated multilayer glue layer 256' has a residual stress of about −2.5 GPa to about 0.8 GPa (i.e., a residual compressive stress, a neutralized stress, or a negligible residual tensile stress) and thus exhibits minimal to no warping, bending, necking, and/or bowing, which correspondingly eliminates or significantly reduces warping of gate structure 125 as evident from FIG. 8E. Gate stack 150 having stress-treated multilayer glue layer 256' has a profile similar to that described above for gate stack 150 having stress-treated glue layer 156', such as a substantially uniform critical dimension and/or necking critical dimensions $CD_N$, bowing critical dimensions $CD_B$, critical dimension differences, necking angles θ, bowing angles φ, or combinations thereof as described above.

Stress-treated multilayer glue layer 256' includes glue sublayers 256 separated by metal layers 260. In the depicted embodiment, stress-treated multilayer glue layer 256' includes three glue sublayers 256 and two metal layers 260, where a first one of glue sublayers 256 physically contacts metal gate layer 154, a first one of metal layers 260 is between the first one of glue sublayers 256 and a second one of glue sublayers 256, and a second one of metal layers 260 is between the second one of glue sublayers 256 and a third one of glue sublayers 256. Glue sublayers 256 have a thickness T1, and metal layers 260 have a thickness T2. In some embodiments, thickness T1 is about 2 Å to about 5 Å.

In some embodiments, thickness T2 is about 2 Å to about 5 Å. Stress-treated multilayer glue layer 256' includes a material that promotes adhesion between metal gate layer 154 and metal fill layer 158, such as a material that includes metal (for example, W, Al, Ta, Ti, Ni, Cu, Co, other suitable metal, or combinations thereof), metal oxides, metal nitrides, metal alloys, or combinations thereof. For example, glue sublayers 256 include a metal and nitrogen, and metal layers 260 include the metal. In the depicted embodiment, glue sublayers 256 are titanium nitride layers (e.g., TiN layers), and metal layers 260 are titanium layers (e.g., Ti layers). In some embodiments, glue sublayers 256 are tantalum nitride layers (e.g., TaN layers), and metal layers 260 are tantalum layers (e.g., Ta layers). As described further below, a hydrogen poisoning process is performed when forming stress-treated multilayer glue layer 256', such that glue sublayers 256 and/or metal layers 260 also include hydrogen. For example, glue sublayers 256 include titanium, nitrogen, and hydrogen, and/or metal layers 260 include titanium and hydrogen. Glue sublayers 256 and metal layers 260 are formed by ALD, PVD, CVD, HDPCVD, MOCVD, RPCVD, PECVD, LPCVD, ALCVD, APCVD, plating, other suitable methods, or combinations thereof.

In some embodiments, forming stress-treated multilayer glue layer 256' includes loading a wafer having device 200 fabricated thereon into a process chamber; heating the wafer to a desired temperature (e.g., a temperature that facilitates chemical reactions needed to form glue sublayers 256 and metal layers 260); performing at least one glue sublayer/metal layer pair (i.e., a deposition cycle that includes depositing a glue sublayer (e.g., a titanium nitride layer), depositing a metal layer (e.g., a titanium layer) over the glue sublayer, and performing a hydrogen poisoning treatment (e.g., an $H_2$ soak); and depositing a top glue sublayer over the at least one glue sublayer/metal layer pair. Depositing glue sublayers 256 and metal layers 160 can include flowing one or more precursors and/or carriers (e.g., $H_2$, $N_2$, Ar, other suitable carrier gas, or combinations thereof) into the process chamber, where the precursors react and/or decompose to form glue sublayers 256 or metal layers 260. In some embodiments, depositing glue sublayers 256 includes introducing a titanium-containing precursor gas (e.g., a titanium tetrachloride ($TiCl_4$) gas), a nitrogen-containing precursor gas (e.g., ammonia ($NH_3$) gas), and carrier gas (e.g., $H_2$ and/or Ar) into the process chamber for a duration that allows for depositing TiN material having thickness T1. In some embodiments, depositing metal layers 260 includes introducing a titanium-containing precursor gas (e.g., $TiCl_4$) and a carrier gas (e.g., $H_2$ and/or Ar) into the process chamber for a duration (reaction time) that allows for depositing Ti material having thickness T2, such as about 10 seconds to about 120 seconds. In some embodiments, performing the hydrogen poisoning treatment includes introducing a hydrogen-containing gas (e.g., $H_2$) into the process chamber for a duration that is sufficient to incorporate hydrogen into glue sublayers 256 and/or metal layers 260, such as about 10 seconds to about 30 seconds. In some embodiments, a hydrogen concentration in stress-treated multilayer glue layer 256' is about 0.5 atomic percent (at %) to about 1 at %. In some embodiments, a temperature maintained in the process chamber when forming stress-treated multilayer glue layer 256' is about 400° C. to about 500° C. Forming stress-treated multilayer glue layer 256' can further include purging any remaining precursors (e.g., unreacted precursors), carriers, and/or byproducts from the process chamber. In some embodiments, the process chamber is purged after depositing each glue sublayer, for example, to remove nitrogen-containing byproducts before depositing the metal layer. In some embodiments, the process chamber is purged after depositing each metal sublayer. In some embodiments, the process chamber is purged after each hydrogen poisoning treatment. In some embodiments, the process chamber is purged after the last deposition cycle and before depositing the top glue sublayer.

Various deposition parameters and hydrogen poisoning treatment parameters can be tuned to alter stress properties of stress-treated multilayer glue layer 256', glue sublayers 256, metal layers 260, or combinations thereof and provide stress-treated multilayer glue layer 256' with desired stress properties (e.g., residual stress less than about 0.8 GPa), such as deposition precursor type, deposition precursor flow rate, carrier gas type, carrier gas flow rate, deposition pressure, deposition temperature, deposition power, deposition time, hydrogen poisoning treatment precursor type, hydrogen gas flow rate during the hydrogen poisoning treatment, hydrogen poisoning treatment time, hydrogen poisoning treatment temperature, other suitable deposition parameters, other hydrogen poisoning treatment parameters, or combinations thereof. For example, deposition temperatures, deposition times, and hydrogen treatment times that are greater than upper ends of the examples provided may alter properties of metal layers 260, glue sublayers 256, metal gate layer 154, gate dielectric layer 152, interfacial layer 152A, or combinations thereof in ways that cause undesired threshold voltage shifts in device 200, while those that are less than lower ends of the examples provided will not reduce residual stress enough to eliminate or significantly reduce warping of gate structure 125. A flow rate of the titanium-containing precursor when depositing glue sublayers 256 can be the same or different than a flow rate of the titanium-containing precursor when depositing metal layers 260. A flow rate of a hydrogen gas when depositing metal layers 260 can be the same or different than a flow rate of the hydrogen gas when performing the hydrogen poisoning treatment. A titanium-containing precursor used when depositing glue sublayers 256 can be the same or different than a titanium-containing precursor used when depositing metal layers 260.

Figure 8G:
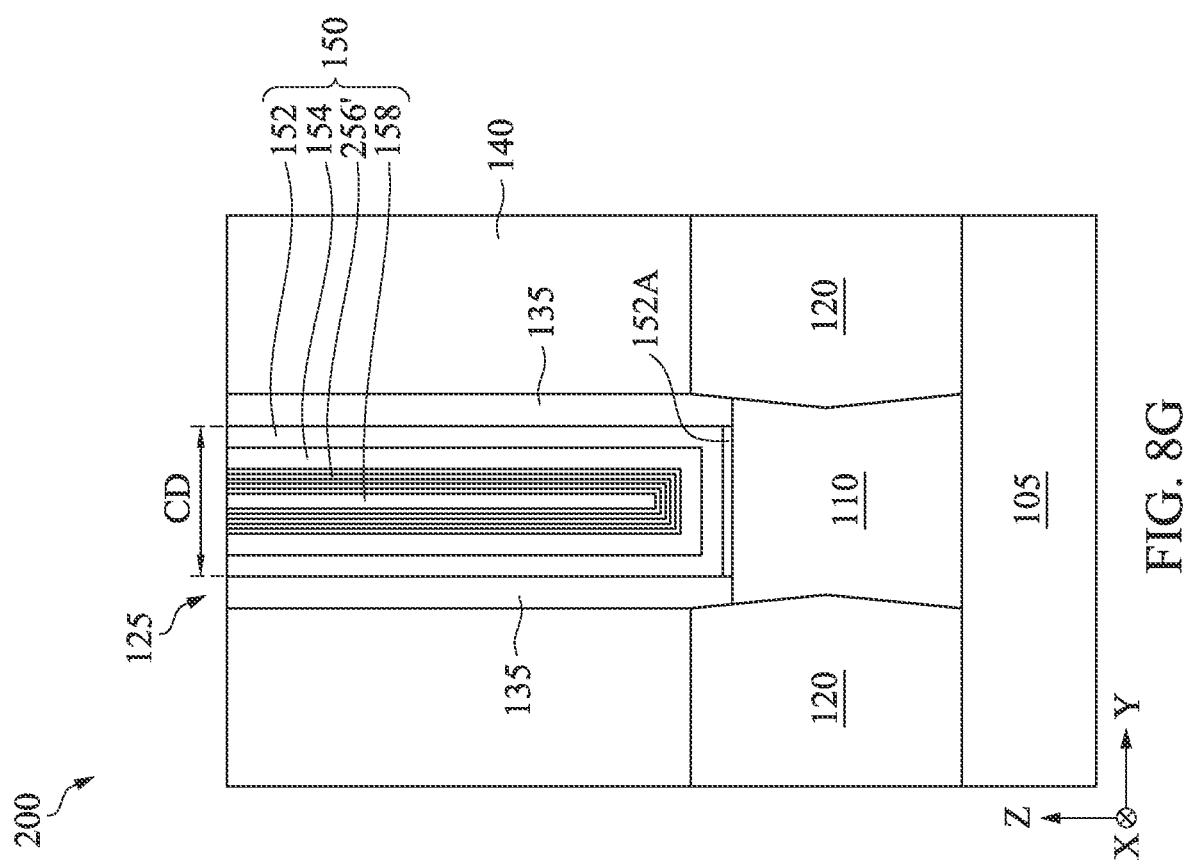

Fabrication of device 200 in FIG. 8F and FIG. 8G then proceeds similar to fabrication of device 100 in FIG. 3H and FIG. 3I, respectively. For example, fabrication includes forming metal fill layer 158 over stress-treated multilayer glue layer 256' (FIG. 8F, fabrication of which is similar to that described with reference to FIG. 3H) and performing a planarization process to remove excess gate materials from device 200, thereby forming gate stack 150 (FIG. 8G, fabrication of which is similar to that described with reference to FIG. 3I). In FIG. 8G, gate stack 150 includes a gate dielectric (e.g., interfacial layer 152A and gate dielectric layer 152) and a gate electrode (e.g., metal gate layer 154, stress-treated multilayer glue layer 256', and metal fill layer 158). Because stress-treated multilayer glue layer 256' has sufficiently low residual stress (e.g., less than about 0.8 GPa and greater than about −2.5 GPa), gate structure 125 has minimal to no warpage, and metal fill layer 158 can completely fill the remainder of gate opening 145 without forming a void in gate stack 150. Consequently, gate stack 150 having stress-treated multilayer glue layer 256' does not have any seams therein, such as seam 160A' and/or seam 160B' (which, as described above, occur when a void is formed in gate stack 150 because metal fill layer 158 insufficiently fills the remainder of gate opening 145 because of the warped profile of gate structure 125 caused by residual tensile stress of a glue layer). The present disclosure also contemplates device 200, which includes gate stack 150 having stress-treated multilayer glue layer 256', being configured as depicted in FIG. 10.

Figure 9B:
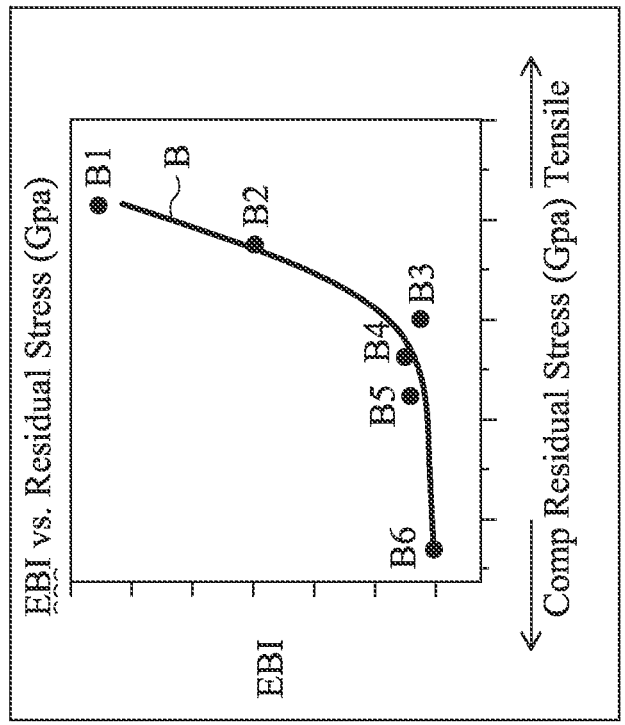
FIG. 9B provides experimental data for wafers having devices fabricated thereon that include gate stacks having glue layers according to various aspects of the present disclosure.
Figure 9A:
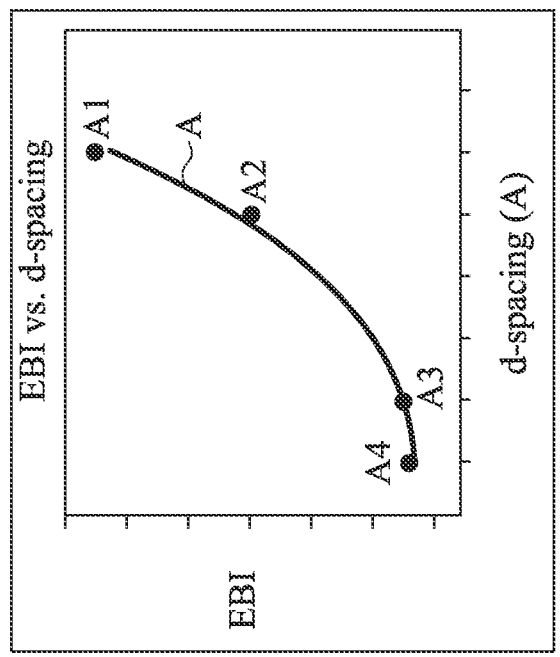
FIG. 9A provides experimental data for wafers having devices fabricated thereon that include gate stacks having glue layers according to various aspects of the present disclosure.

FIG. 9A and FIG. 9B provide experimental data for wafers having devices fabricated thereon that include gate stacks having glue layers according to various aspects of the present disclosure. FIG. 9A is an exemplary plot 310 of defect counts obtained by electron beam inspection (EBI) as a function of d-spacing (in Å) of glue layers. Defects detected by EBI can include voids and/or seams in the gate stacks. In FIG. 9A, EBI and d-spacing of glue layers was evaluated for four wafers:

A1, a wafer that includes devices with gate stacks having glue layers that were not subjected to a stress reduction treatment, such as described above with reference to FIG. 4A, FIG. 4B, FIG. 5, FIG. 6A, FIG. 6B, and FIG. 7;

A2, a wafer that includes devices with gate stacks having stress-treated glue layers, where the stress reduction treatment was an ion implantation process, such as described above with reference to FIGS. 3A-3I;

A3, a wafer that includes devices with gate stacks having stress-treated glue layers, where the stress reduction treatment was a thermal process, such as described above with reference to FIGS. 3A-3I; and A4, a wafer that includes devices with gate stacks having stress-treated multilayer glue layers, such as described above with reference to FIGS. 8A-8G.

FIG. 9B is an exemplary plot 320 of defect counts obtained by EBI as a function of stress (in GPa) of glue layers. In FIG. 9B, EBI and stress of glue layers was evaluated for six wafers:

B1, a wafer that includes devices with gate stacks having glue layers that were not subjected to a stress reduction treatment, such as described above with reference to FIG. 4A, FIG. 4B, FIG. 5, FIG. 6A, FIG. 6B, and FIG. 7;

B2, a wafer that includes devices with gate stacks having stress-treated glue layers, where the stress reduction treatment was an ion implantation process, such as described above with reference to FIGS. 3A-3I;

B3 & B4, wafers that include devices with gate stacks having stress-treated glue layers, where the stress reduction treatment was a thermal process, such as described above with reference to FIGS. 3A-3I; and B5 & B6, wafers that include devices with gate stacks having stress-treated multilayer glue layers, such as described above with reference to FIGS. 8A-8G.

From FIG. 9A and FIG. 9B, it is evident that defects, such as voids and/or seams in gate stacks, are directly proportional to d-spacing of glue layers of the gate stacks and/or residual stress of glue layers of the gate stacks. In other words, defects decrease as d-spacing and/or residual stress of glue layers of the gate stacks decrease, and defects increase as d-spacing and/or residual stress of glue layers of the gate stacks increase. For example, wafers that include devices with gate stacks having glue layers subjected to stress reduction treatments (e.g., A2-A4 and B2-B6) have less defects than wafers that include devices with gate stacks having glue layers that were not subjected to stress reduction treatments (e.g., A1 and B1), and wafers having glue layers subjected to stress reduction treatments (e.g., A2-A4 and B2-B6) have smaller d-spacing and less residual stress than wafers having glue layers that were not subjected to stress reduction treatments (e.g., A1 and B1). In plot 310 of FIG. 9A, a line A fitted to the experimental data for wafers A1-A4 indicates that defects decrease as d-spacing of glue layers of the gate stacks decrease. In plot 320 of FIG. 9B, a line B fitted to the experimental data for wafers B1-B6 indicates that defects decrease as residual stress of glue layers of the gate stacks decrease. Accordingly, providing gate stacks with stress-treated glue layers, such as stress-treated glue layer 156' and stress-treated multilayer glue layer 256', can significantly reduce and/or eliminate warping of the gate stacks, which correspondingly reduces and/or eliminates voids and/or seams in the gate stacks and reduces and/or eliminates damage to channel regions (over which the gate stacks are fabricated). Different embodiments may have different advantages, and no particular advantage is necessarily required of any embodiment.

The present disclosure provides for many different embodiments. Various methods for forming gate stacks (e.g., high-k/metal gates) with improved profiles (e.g., minimal to no warping, bending, bowing, and necking and/or substantially vertical sidewalls) and related gate structures are disclosed herein, which may be implemented in a variety of device types. For example, the gate stacks described herein are suitable for planar field-effect transistors (FETs), multi-gate transistors, such as fin-like FETs (FinFETs), gate-all-around (GAA) transistors, omega-gate (Ω-gate) devices, pi-gate (Π-gate) devices, or combinations thereof as well as strained-semiconductor devices, silicon-on-insulator (SOI) devices, partially-depleted SOI devices, fully-depleted SOI devices, other devices, or combinations thereof. The present disclosure contemplates that one of ordinary skill may recognize other IC devices that can benefit from the gate stacks and/or the gate formation techniques described herein.

An exemplary method for forming a gate stack includes depositing a gate dielectric layer on a channel region, depositing a work function layer on the gate dielectric layer, forming a stress-treated glue layer on the work function layer, and depositing a metal fill layer on the stress-treated glue layer. In some embodiments, forming the stress-treated glue layer over the work function layer includes depositing a metal nitride layer over the work function layer and introducing a non-metal species into the metal nitride layer. The non-metal species is argon, nitrogen, fluorine, oxygen, hydrogen, or a combination thereof. In some embodiments, the non-metal species is introduced into the metal nitride layer by an ion implantation process. In some embodiments, the non-metal species is introduced into the metal nitride layer by a thermal process performed in a gas atmosphere. In some embodiments, forming the stress-treated glue layer over the work function layer includes depositing a first glue sublayer over the work function layer, depositing a metal layer over the first glue sublayer, depositing a second glue sublayer over the metal layer, and performing a hydrogen poisoning treatment.

In some embodiments, the gate stack has a bowing critical dimension that is about 30% to about 35% greater than a pre-defined critical dimension of the gate stack and the introducing the non-metal species into the metal nitride layer is configured to reduce the bowing critical dimension, such that the bowing critical dimension is about 0% to about 5% greater than the pre-defined critical dimension. In some embodiments, the metal nitride layer has a first d-spacing and introducing the non-metal species into the metal nitride layer is configured to reduce the first d-spacing to a second d-spacing. In some embodiments, the metal nitride layer has a first nitrogen concentration and the introducing the non-metal species into the metal nitride layer is configured to increase the first nitrogen concentration to a second nitrogen concentration.

Another exemplary method includes forming a gate opening that exposes a channel region, forming a gate dielectric layer in the gate opening, forming a work function layer in the gate opening over the gate dielectric layer, forming a metal glue layer in the gate opening over the work function layer, performing a stress reduction treatment on the metal glue layer, and after the stress reduction treatment, forming a metal fill layer in the gate opening over the metal glue layer. The gate dielectric layer, the work function layer, the metal glue layer, and the metal fill layer form a gate stack of a gate structure that fills the gate opening. In some embodiments, the metal glue layer has residual tensile stress, and the performing the stress reduction treatment on the metal glue layer includes changing the residual tensile stress to residual compressive stress. In some embodiments, the metal glue layer has residual stress greater than about 1.0 GPa, and the performing the stress reduction treatment on the metal glue layer includes reducing the residual stress to less than about 1.0 GPa. In some embodiments, the gate structure has a first gate spacer and a second gate spacer, the gate opening is between the first gate spacer and the second gate spacer, a first distance is between the first gate spacer and the second gate spacer before forming the metal glue layer in the gate opening, a second distance is between the first gate spacer and the second gate spacer after forming the metal glue layer in the gate opening, and the stress reduction treatment is tuned to reduce the second distance to the first distance. In some embodiments, performing the stress reduction treatment on the metal glue layer includes performing an ion implantation process on the metal glue layer. In some embodiments, performing the stress reduction treatment on the metal glue layer includes annealing the metal glue layer in a gas atmosphere and, in some embodiment, performing a wet clean process before the annealing the metal glue layer in the gas atmosphere.

An exemplary device includes a channel region disposed between epitaxial source/drains and a gate stack disposed over the channel region. The gate stack includes a gate dielectric layer, a work function layer over the gate dielectric layer, a metal glue layer over the work function layer, and a metal fill layer over the metal glue layer. The metal glue layer has a residual stress of about −2.5 gigapascals (GPa) to about 0.8 GPa. In some embodiments, the metal glue layer includes a metal and a non-metal dopant and a concentration of the non-metal dopant is greater than about $9 \times 10^{16}$ cm$^{-3}$. In some embodiments, the metal glue layer includes a metal layer disposed between a first glue sublayer and a second glue sublayer, the first glue sublayer and the second glue sublayer include a metal and nitrogen, and the metal layer includes the metal. In some embodiments, the metal glue layer is a titanium nitride layer and a ratio of nitrogen to titanium in the titanium nitride layer is about 1.3 to about 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate stack, the method comprising:
   depositing a gate dielectric layer on a channel region;
   depositing a work function layer on the gate dielectric layer;
   forming a stress-treated glue layer on the work function layer, wherein the forming the stress-treated glue layer includes a deposition process and a stress reduction treatment process, wherein the deposition process includes:
      depositing a first glue sublayer over the work function layer,
      depositing a metal layer over the first glue sublayer, and
      depositing a second glue sublayer over the metal layer; and
   the stress reduction treatment process includes performing a hydrogen poisoning treatment; and
   depositing a metal fill layer on the stress-treated glue layer.

2. The method of claim 1, wherein:
   the depositing the first glue sublayer includes depositing a first metal nitride layer and the depositing the second glue sublayer includes depositing a second metal nitride layer.

3. The method of claim 2, wherein the depositing the first metal nitride layer and the depositing the second metal nitride layer includes depositing a first titanium nitride layer and a second titanium nitride layer, respectively.

4. The method of claim 3, wherein the depositing the metal layer includes depositing a titanium layer.

5. The method of claim 2, wherein the depositing the first metal nitride layer and the depositing the second metal nitride layer includes depositing a first tantalum nitride layer and a second tantalum nitride layer, respectively.

6. The method of claim 5, wherein the depositing the metal layer includes depositing a tantalum layer.

7. The method of claim 1, wherein the hydrogen poisoning treatment introduces hydrogen into the stress-treated glue layer.

8. The method of claim 7, wherein the hydrogen poisoning treatment includes exposing the stress-treated glue layer to a hydrogen-containing gas for about 10 seconds to about 30 seconds.

9. The method of claim 1, wherein each of the first glue sublayer, the metal layer, and the second glue sublayer has a respective thickness of about 2 Å to about 5 Å.

10. A method comprising:
    forming a gate opening that exposes a channel region;
    forming a gate dielectric layer in the gate opening;
    forming a work function layer in the gate opening over the gate dielectric layer;
    forming a metal glue layer in the gate opening over the work function layer;
    performing a stress reduction treatment on the metal glue layer;
    after the stress reduction treatment, forming a metal fill layer in the gate opening over the metal glue layer, wherein the gate dielectric layer, the work function layer, the metal glue layer, and the metal fill layer form a gate stack of a gate structure that fills the gate opening; and
    wherein:
       the gate structure has a first gate spacer and a second gate spacer,
       the gate opening is between the first gate spacer and the second gate spacer, a first distance is between the first gate spacer and the second gate spacer before forming the metal glue layer in the gate opening, a second distance is between the first gate spacer and the second gate spacer after forming the metal glue layer in the gate opening, and the stress reduction treatment is tuned to reduce the second distance to the first distance.

11. The method of claim 10, wherein the metal glue layer has residual tensile stress, and the performing the stress reduction treatment on the metal glue layer includes changing the residual tensile stress to residual compressive stress.

12. The method of claim 10, wherein the metal glue layer has residual stress of at least 1.0 GPa, and the performing the stress reduction treatment on the metal glue layer includes reducing the residual stress to less than 1.0 GPa.

13. The method of claim 1, wherein the ion implantation process is an argon implantation process.

14. The method of claim 10, wherein the performing the stress reduction treatment on the metal glue layer includes performing an ion implantation process on the metal glue layer.

15. The method of claim 10, wherein the performing the stress reduction treatment on the metal glue layer includes annealing the metal glue layer in a gas atmosphere.

16. The method of claim 15, wherein the performing the stress reduction treatment on the metal glue layer includes performing a wet clean process before the annealing the metal glue layer in the gas atmosphere.

17. A device comprising:
a channel region disposed between epitaxial source/drains; and
a gate stack disposed over the channel region, wherein the gate stack includes:
a gate dielectric layer,
a work function layer over the gate dielectric layer,
a metal glue layer over the work function layer, wherein the metal glue layer has a residual stress of −2.5 gigapascals (GPa) to 0.8 GPa, wherein the metal glue layer includes a metal layer disposed between a first glue sublayer and a second glue sublayer, wherein the first glue sublayer and the second glue sublayer include a metal and nitrogen and the metal layer includes the metal, and
a metal fill layer over the metal glue layer.

18. The device of claim 17, wherein the metal is a first metal, and the metal fill layer includes a second metal, and the second metal is different than the first metal.

19. The device of claim 18, wherein the first metal is titanium and the second metal is tungsten.

20. The device of claim 17, wherein the metal glue layer includes hydrogen, and a concentration of the hydrogen in the metal glue layer is about 0.5 atomic percent (at %) to about 1 at %.

* * * * *